United States Patent
Fujimura et al.

(10) Patent No.: US 12,372,864 B2
(45) Date of Patent: Jul. 29, 2025

(54) METHODS AND SYSTEMS TO DETERMINE SHAPES FOR SEMICONDUCTOR OR FLAT PANEL DISPLAY FABRICATION

(71) Applicant: D2S, Inc., San Jose, CA (US)

(72) Inventors: Akira Fujimura, Saratoga, CA (US); Nagesh Shirali, San Jose, CA (US); Donald Oriordan, Sunnyvale, CA (US)

(73) Assignee: D2S, INC., San Jose, CA (US)

( * ) Notice: Subject to any disclaimer, the term of this patent is extended or adjusted under 35 U.S.C. 154(b) by 0 days.

(21) Appl. No.: 16/949,270

(22) Filed: Oct. 22, 2020

(65) Prior Publication Data

US 2022/0128899 A1    Apr. 28, 2022

(51) Int. Cl.
 *G03F 1/36* (2012.01)
 *G03F 7/00* (2006.01)
 (Continued)

(52) U.S. Cl.
 CPC .............. *G06F 30/398* (2020.01); *G03F 1/36* (2013.01); *G03F 7/70441* (2013.01); *G06N 3/04* (2013.01); *G06N 3/08* (2013.01)

(58) Field of Classification Search
 CPC . G06F 30/398; G03F 1/36; G03F 1/70; G03F 1/78; G03F 7/705; G03F 7/70441;
 (Continued)

(56) References Cited

U.S. PATENT DOCUMENTS 5,698,346 A    12/1997  Sugawara
6,042,257 A    3/2000  Tsudaka
 (Continued)

FOREIGN PATENT DOCUMENTS

CN    104051234 A  *  9/2014  .............. G03F 1/70
CN    107065447 A  *  8/2017
 (Continued)

OTHER PUBLICATIONS

Ibtehaz and Rahman, MultiResUNet: Rethinking the U-Net Architecture for Multimodal Biomedical Image Segmentation, Feb. 2019, https://arxiv.org/pdf/1902.04049.pdf.
 (Continued)

*Primary Examiner* — Jack Chiang
*Assistant Examiner* — Brandon Bowers
(74) *Attorney, Agent, or Firm* — ADELI LLP

(57) ABSTRACT

Methods for calculating a pattern to be manufactured on a substrate include inputting a physical design pattern, determining a plurality of possible neighborhoods for the physical design pattern, generating a plurality of possible mask designs for the physical design pattern, calculating a plurality of possible patterns on the substrate, calculating a variation band from the plurality of possible patterns, and modifying the physical design pattern to reduce the variation band. Embodiments also include inputting a set of parameters for a neural network to calculate a pattern to be manufactured on a substrate, calculating a plurality of patterns to be manufactured on the substrate for the physical design in each possible neighborhood of the plurality of possible neighborhoods, training the neural network with the calculated plurality of patterns, and adjusting the set of parameters to reduce the manufacturing variation for the calculated plurality of patterns to be manufactured on a substrate.

26 Claims, 18 Drawing Sheets

(51) Int. Cl.
*G06F 30/398* (2020.01)
*G06N 3/04* (2023.01)
*G06N 3/08* (2023.01)

(58) Field of Classification Search
CPC ............ G06N 3/04; G06N 3/08; G06N 3/045;
G06N 5/01; G06N 20/00; G06N 3/0455;
G06N 3/0464; G06N 3/082; H01J 37/317;
H01J 2237/31761; H01J 37/3177
See application file for complete search history.

(56) References Cited

U.S. PATENT DOCUMENTS

| | | | |
|---|---|---|---|
| 7,269,817 B2 * | 9/2007 | Heng | G03F 1/36 716/132 |
| 7,353,493 B2 | 4/2008 | Akiyama | |
| 7,355,673 B2 | 4/2008 | Hsu et al. | |
| 7,401,319 B2 * | 7/2008 | Horng | G06F 30/392 700/121 |
| 7,526,748 B2 | 4/2009 | Kotani et al. | |
| 7,754,401 B2 | 7/2010 | Fujimura et al. | |
| 7,921,383 B1 * | 4/2011 | Wei | G03F 7/705 716/54 |
| 8,166,423 B2 * | 4/2012 | Mansfield | G03F 7/70441 716/54 |
| 8,336,006 B2 * | 12/2012 | Kodera | G06F 30/39 716/132 |
| 8,429,573 B2 | 4/2013 | Ogino et al. | |
| 8,473,875 B2 | 6/2013 | Fujimura et al. | |
| 8,667,443 B2 * | 3/2014 | Smayling | G06F 30/394 716/122 |
| 8,719,739 B2 * | 5/2014 | Fujimura | G06F 30/367 716/53 |
| 8,818,072 B2 * | 8/2014 | Ong | G06T 7/001 382/144 |
| 9,355,204 B2 * | 5/2016 | Seo | G06F 30/398 |
| 9,430,442 B2 * | 8/2016 | Iyer | G06F 30/327 |
| 9,922,161 B2 | 3/2018 | Kahng et al. | |
| 10,012,900 B2 * | 7/2018 | Kim | G03F 1/78 |
| 10,346,740 B2 | 7/2019 | Zhang et al. | |
| 10,444,629 B2 | 10/2019 | Zable | |
| 10,520,830 B2 * | 12/2019 | Kicken | G03F 7/70516 |
| 10,670,973 B2 * | 6/2020 | Zou | G03F 7/70433 |
| 10,678,142 B2 * | 6/2020 | Jheng | G03F 1/36 |
| 10,762,267 B2 * | 9/2020 | Kamon | G06F 30/39 |
| 10,923,318 B2 * | 2/2021 | Gledhill | G06N 3/045 |
| 11,043,359 B2 * | 6/2021 | Nakamura | H01J 37/265 |
| 2004/0210863 A1 | 10/2004 | Culp et al. | |
| 2005/0132306 A1 | 6/2005 | Smith et al. | |
| 2005/0251771 A1 | 11/2005 | Robles | |
| 2006/0190911 A1 * | 8/2006 | Stivers | B82Y 10/00 716/52 |
| 2007/0235665 A1 * | 10/2007 | Shamoun | B82Y 40/00 250/492.23 |
| 2008/0109766 A1 | 5/2008 | Song et al. | |
| 2011/0061030 A1 | 3/2011 | Mansfield et al. | |
| 2011/0089345 A1 | 4/2011 | Komagata et al. | |
| 2012/0051621 A1 * | 3/2012 | Ong | G03F 1/84 382/144 |
| 2012/0151422 A1 | 6/2012 | White et al. | |
| 2013/0022929 A1 | 1/2013 | Komagata et al. | |
| 2013/0070222 A1 | 3/2013 | Fujimura | |
| 2013/0159943 A1 | 6/2013 | Agarwal et al. | |
| 2013/0283216 A1 | 10/2013 | Pearman et al. | |
| 2013/0283218 A1 * | 10/2013 | Fujimura | G03F 1/36 716/54 |
| 2016/0125120 A1 | 5/2016 | Yu et al. | |
| 2017/0194126 A1 | 7/2017 | Bhaskar et al. | |
| 2017/0357911 A1 | 12/2017 | Liu et al. | |
| 2018/0067900 A1 | 3/2018 | Mos et al. | |
| 2018/0374677 A1 | 12/2018 | Fay et al. | |
| 2019/0146355 A1 * | 5/2019 | Jheng | G03F 1/36 716/53 |
| 2019/0197213 A1 | 6/2019 | Ungar | |
| 2019/0206041 A1 | 7/2019 | Fang et al. | |
| 2019/0377849 A1 | 12/2019 | Sha et al. | |
| 2019/0385300 A1 | 12/2019 | Baidya et al. | |
| 2020/0051781 A1 * | 2/2020 | Fujimura | G06N 3/10 |
| 2020/0065453 A1 | 2/2020 | Kim et al. | |
| 2020/0134131 A1 | 4/2020 | Tien et al. | |
| 2020/0184137 A1 | 6/2020 | Tsutsui et al. | |
| 2020/0279065 A1 * | 9/2020 | Ungar | G03F 7/705 |
| 2020/0326632 A1 | 10/2020 | Fang et al. | |
| 2020/0380089 A1 | 11/2020 | Gheith et al. | |
| 2020/0380362 A1 | 12/2020 | Cao et al. | |
| 2020/0387660 A1 | 12/2020 | Cecil | |
| 2021/0141988 A1 * | 5/2021 | Ungar | G03F 7/705 |
| 2021/0181620 A1 | 6/2021 | Poonawala et al. | |
| 2021/0216697 A1 | 7/2021 | Brink et al. | |
| 2021/0232748 A1 * | 7/2021 | Hsu | G03F 1/70 |
| 2021/0048741 A1 | 9/2021 | Lugg et al. | |
| 2021/0279878 A1 | 9/2021 | Adler et al. | |
| 2021/0364450 A1 * | 11/2021 | Lauber | G06T 7/0004 |
| 2021/0397172 A1 | 12/2021 | Slachter et al. | |
| 2022/0035237 A1 * | 2/2022 | Lee | G03F 1/76 |
| 2022/0050381 A1 | 2/2022 | Biswas et al. | |
| 2022/0187713 A1 * | 6/2022 | Middlebrooks | G06N 3/045 |
| 2022/0299881 A1 | 9/2022 | Zheng et al. | |
| 2023/0024684 A1 | 1/2023 | Fujimura et al. | |
| 2023/0027655 A1 | 1/2023 | Fujimura et al. | |
| 2023/0032510 A1 | 2/2023 | Fujimura et al. | |
| 2023/0107556 A1 * | 4/2023 | Tao | G03F 1/36 716/53 |
| 2023/0186009 A1 | 6/2023 | Fujimura et al. | |

FOREIGN PATENT DOCUMENTS

| | | | |
|---|---|---|---|
| CN | 107438842 A * | 12/2017 | |
| CN | 111758072 A * | 10/2020 | G03F 1/36 |
| CN | 113168085 A * | 7/2021 | |
| CN | 113168115 A * | 7/2021 | |
| EP | 3951496 A1 * | 2/2022 | |
| EP | 4205176 A1 | 7/2023 | |
| JP | H08202020 A | 8/1996 | |
| JP | H08248614 A | 9/1996 | |
| JP | 2001174974 A | 6/2001 | |
| JP | 2004341160 A | 12/2004 | |
| JP | 2006053248 A | 2/2006 | |
| JP | 2007536581 A * | 12/2007 | |
| JP | 2009170743 A | 7/2009 | |
| JP | 2010146024 A | 7/2010 | |
| JP | 2012181298 A | 9/2012 | |
| JP | 2014530494 A | 11/2014 | |
| JP | 2021509208 A * | 3/2021 | |
| KR | 1020190004000 A | 1/2019 | |
| KR | 102170578 B1 * | 10/2020 | |
| KR | 20210010897 A * | 1/2021 | |
| KR | 102377411 B1 * | 3/2022 | |
| TW | 201346436 A * | 11/2013 | G03F 1/36 |
| TW | 201423287 A * | 6/2014 | G03F 1/20 |
| TW | 201905578 A | 2/2019 | |
| TW | 1710763 B * | 11/2020 | |
| TW | 202113501 A | 4/2021 | |
| TW | 202121050 A | 6/2021 | |
| WO | WO-2019115426 A1 * | 6/2019 | G01N 21/9505 |
| WO | 2020193095 A1 | 10/2020 | |
| WO | WO-2021043936 A1 * | 3/2021 | G03F 7/705 |
| WO | 2022086825 A1 | 4/2022 | |

OTHER PUBLICATIONS

Ronneberger et al., U-Net: Convolutional Networks for Biomedical Image Segmentation, May 2015, https://arxiv.org/pdf/1505.04597.pdf.

Ao, Jianchang, et al., "Delay-Driven Layer Assignment in Global Routing under Multi-tier Interconnect Structure," Mar. 2013, 7 pages, ACM, retrieved from https://dl.acm.org/doi/10.1145/2451916.2451942.

Author Unknown, "Deep reinforcement learning," Wikipedia, Jun. 16, 2022, 6 page, Wikipedia.com.

Author Unknown, "Jaccard index," Wikipedia, Jun. 19, 2022, 9 page, Wikipedia.com.

(56) References Cited

OTHER PUBLICATIONS

Chen, Tai-Chen, "Multilevel Full-Chip Gridless Routing With Applications to Optical-Proximity Correction," Jun. 2007, 13 pages, IEEE, retrieved from http://cc.ee.ntu.edu.tw/~ywchang/Papers/tcad07-mgr.pdf.

Dai, Wayne Wei-Ming, "Rubber band routing and dynamic data representation," 1990 IEEE International Conference on Computer-Aided Design, Nov. 11-15, 1990, 2 pages, IEEE, Santa Clara, California, USA.

Elmore, W.C., "The Transient Response of Damped Linear Networks with Particular Regard to Wideband Amplifiers," Journal of Applied Physics, Jan. 1948, 9 pages, retrieved from http://algos.inesc-id.pt/projectos/exachip/ref16.pdf.

Kwan, Joe, et al., "Applying Machine Learning Techniques to Accelerate Advanced Process Yield Ramp," Jan. 5, 2021, 29 pages, Siemens Digital Industries Software, Munich, Germany.

Lin, Yibo, et al., "Machine Learning for Yield Learning and Optimization," ECE Department, University of Texas, Jul. 15, 2021, 10 pages, IEEE, Austin, Texas, USA.

Mitchell, Robin, "Imec Demonstrates Buried Power Rails in FinFET CMOS," Mar. 17, 2021, 6 pages, EPM, retrieved from https://www.electropages.com/blog/2021/03/imec-demonstrates-buried-power-rails-finfet-cmos.

Mitra, Joydeep, "Radar: RET-Aware Detailed Routing Using Fast Lithography Simulations," Proceedings 2005, 42nd Design Automation Conference, Jun. 13-17, 2005, 6 pages, IEEE, retrieved from https://citeseerx.ist.psu.edu/ viewdoc/download?doi=10.1.1.103.2367&rep=rep1&type=pdf.

Pang, Linyong, et al., "How GPU-Accelerated Simulation Enables Applied Deep Learning for Masks and Wafers," Month Unknown 2019, 10 pages, D2S, Inc., San Jose, California, USA.

Pang, Linyong, et al., "Making Digital Twins using the Deep Learning Kit (DLK)," Month Unknown 2019, 13 pages, D2S, Inc., San Jose, California, USA.

PCT International Search Report and Written Opinion of Commonly Owned International Patent Application PCT/US2021/055319 (D2S.P0001PCT), mailing date Feb. 17, 2022, 17 pages, International Searching Authority (US).

Pearman, Ryan, et al., "Adopting curvilinear shapes for production ILT: challenges and opportunities," Month Unknown, 14 pages, D2S, Inc., retrieved from https://design2silicon.com/wp-content/uploads/2019/11/Manuscript_Pearman_Bacus_2019-v4final.no-comments.pdf.

Li, Yongfu et al., "Advanced In-Design Auto-Fixing Flow for Cell Abutment Pattern Matching Weakpoints" Synopsys Jsers Group 2017, May 2018, 11 pages, retrieved from https://www.researchgate.net/publication/325414052_Advanced_In-Design_Auto-Fixing_Flow_for_Cell_Abutment_Pattern_Matching_Weakpoints.

Prasad, Divya, "Can we Bury our Scaling Problems with Buried Power Rails and Back-side Power Delivery?," Mar. 5, 2020, 8 pages, Arm Limited, retrieved from https://community.arm.com/arm-research/b/articles/posts/can-we-bury-our-scaling-problems-with-buried-power-rails-and-back-side-power-delivery.

Ren, Haoxing (Mark), "Machine Learning and Deep Learning Applications in Design Automation and Practical Issues," Dac 19 Tutorial, Month Unknown 2019, 55 pages, Nvidia Corporation, Santa Clara, California, USA.

Teig, S., "The X architecture: not your father's diagonal wiring, " SLIP '02: Proceedings of the 2002 international workshop on System-level interconnect prediction, Apr. 6, 2002, 4 pages, ACM, retrieved from https://dl.acm.org/doi/10.1145/505348.505355.

Jia, Ningning, et al., "Machine Learning for Inverse Lithography: using stochastic gradient descent for robust photomask synthesis," Journal of Optics, Apr. 1, 2010, 9 pages, vol. 12, IOP Publishing, retrieved from https://www.eee.hku.hk/optima/pub/journal/1004_JO.pdf Pang, Linyong, "Inverse Lithography Technology: 30 years from concept to practical, full-chip reality," Journal of Micro/Nanopatterning, Materials, and Metrology, Aug. 31, 2021, 49 pages, vol. 20(3), SPIE, retrieved from https://www.spiedigitallibrary.org/journals/journal-of-micro-nanopatterning-materials-and-metrology/vol. 20/ ssue-U.S. Appl. No. 03/030,901/Inverse-lithography-technology-30-years-from-concept-to-practical/10.1117/1.JMM.20.3.030901.full.

Cecil, Thomas, et al., "Establishing Fast, Practical, Full-Chip ILT Flows Using Machine Learning," SPIE Proceedings 11327, Optical Microlithography XXXIII, Mar. 23, 2020, 19 pages, vol. 1132706, SPIE, San Jose, California, USA.

Chen, Kun-Yuan, et al., "Full-Chip Application of Machine Learning SRAFs on DRAM Case Using Auto Pattern Selection," SPIE Proceedings 10961, Optical Microlithography XXXII, Oct. 10, 2019, 13 pages, vol. 1096108, SPIE, San Jose, California, USA.

Feng, Yaobin, et al., "Freeform Mask Optimization Using Advanced Image based M3D Inverse Lithography and 3D- Nand Full Chip OPC Application," SPIE Proceedings 10587, Optical Microlithography XXXI, Mar. 20, 2018, 11 pages, vol. 105870G, Spie, San Jose, California, USA.

Liu, Peng, "Mask Synthesis Using Machine Learning Software and Hardware Platforms," SPIE Proceedings 11327, Optical Microlithography XXXIII, Mar. 23, 2020, 17 pages, vol. 1132707, SPIE, San Jose, California, USA.

Shi, Xuelong, et al., "Physics based feature Vector Design: a Critical Step Towards Machine Learning based Inverse Lithography," SPIE Proceedings 11327, Optical Microlithography XXXIII, Mar. 23, 2020, 8 pages, vol. 113270A, SPIE, San Jose, California, USA.

Wang, Shibing, et al., "Efficient Full-Chip SRAF Placement Using Machine Learning for Best Accuracy and Improved Consistency," SPIE Proceedings 10587, Optical Microlithography XXXI, Mar. 20, 2018, 10 pages, vol. 105870N, SPIE, San Jose, California, USA.

Wang, Shibing, et al., "Machine Learning Assisted SRAF Placement for Full Chip," SPIE Proceedings 10451, Photomask Technology 2017, Oct. 16, 2017, 8 pages, vol. 104510D, SPIE, Monterey, California, USA.

Ajayi, Tutu, et al., "OpenROAD: Toward a Self-Driving, Open-Source Digital Layout Implementation Tool Chain," Proceedings of Government Microcircuit Applications and Critical Technology Conference, Jan. 1, 2019, 6 pages, National Science Foundation, retrieved from https://vlsicad.ucsd.edu/Publications/Conferences/370/c370.pdf.

Author Unknown, "D2S Enables "Stitchless" Full-Chip Inverse Lithography Technology in a Single Day for the Multi-Beam Era," Press Release, Sep. 16, 2019, 3 pages, D2S, Inc., San Jose, California, USA.

Author Unknown, "D2S Unveils Industry's First Mask-Wafer Double Simulation Platform," Press Release, Sep. 20, 2011, 3 pages, D2S, Inc., San Jose, California, USA.

Author Unknown, "Multiple patterning," Wikipedia, Oct. 10, 2020, 22 pages, Wikipedia.com.

Author Unknown, "Optical proximity correction," Wikipedia, Apr. 28, 2019, 5 pages, Wikipedia.com.

Author Unknown, "Rasterisation," Wikipedia, Aug. 21, 2020, 4 pages, Wikipedia.com.

Author Unknown, "TrueMask® DS," Exact Date Unknown but Before May 2020, 3 pages, D2S, Inc., retrieved from https://design2silicon.com/products/truemask-ds/.

Author Unknown, "TrueMask® ILT Backgrounder Stitchless Full-Chip ILT in a Day," Backgrounder, Sep. 2019, 6 pages, D2S, Inc., San Jose, California, USA.

Author Unknown, "TrueMask® ILT," Exact Date Unknown but Before May 2020, 7 pages, D2S, Inc., retrieved from https://design2silicon.com/products/truemask-ilt/.

Pang, Linyong (Leo), et al., "Study of Mask and Wafer Co-design That Utilizes a New Extreme SIMD Approach to Computing in Memory Manufacturing: Full-Chip Curvilinear ILT in a Day," SPIE Proceedings 11148, Photomask Technology 2019, Oct. 3, 2019, 16 pages, vol. 111480U, SPIE, retrieved from https://design2silicon.com/wp-content/uploads/2019/11/2019-BACUS-Full-Chip-Curvilinear-ILT-091219s-003.pdf.

Pradipta, Geraldo, et al., "A Machine Learning Based Parasitic Extraction Tool," Oct. 31, 2019, 3 pages, University of Minnesota, Minneapolis, Minnesota, USA.

(56) References Cited

OTHER PUBLICATIONS

Sole, Marc Pons, "Layout Regularity for Design and Manufacturability," Doctoral Thesis, Jul. 8, 2012, 185 pages, Technical University of Catalonia, Barcelona, Spain.
Sperling, Ed, "Design Rule Complexity Rising," Semiconductor Engineering - Deep Insights for the Tech Industry, Apr. 19, 2018, 16 pages, SMG, retrieved from https://semiengineering.com/design-rule-complexity-rising/.
Yang, Dingcheng, et al., "CNN-Cap: Effective Convolutional Neural Network Based Capacitance Models for Full- Chip Parasitic Extraction," Jul. 14, 2021, 9 pages, retrieved from https://arxiv.org/pdf/2107.06511.pdf.
Tripathi, Vikas, et al., "Context-Aware DFM Rule Analysis and Scoring Using Machine Learning," Aug. 16, 2018, 9 pages, retrieved from https://arxiv.org/pdf/1808.05999.pdf.

* cited by examiner

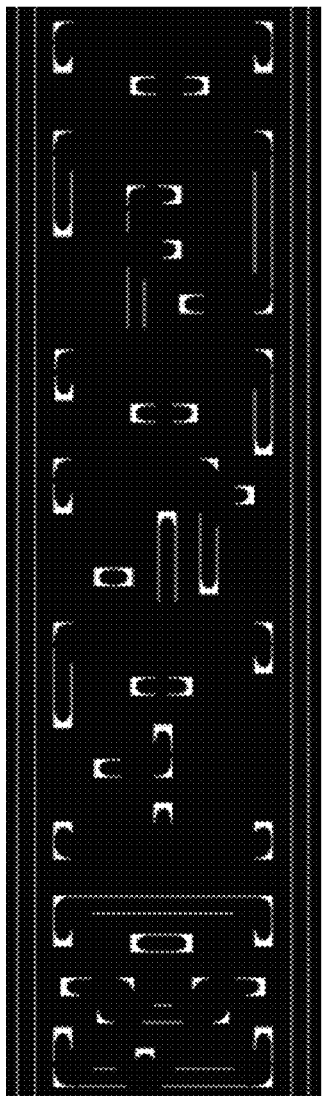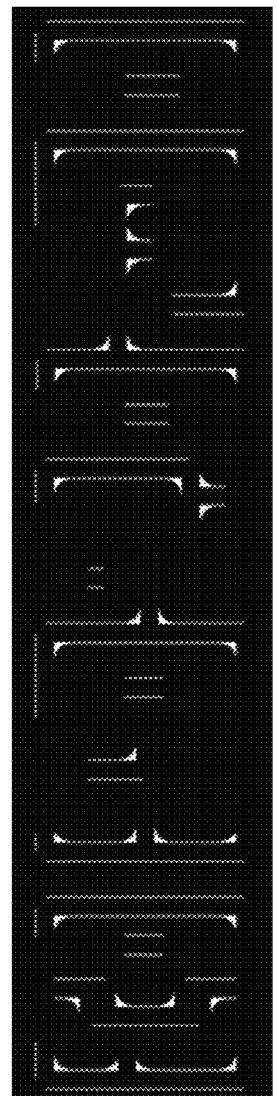
1401　　1402
FIG. 14

METHODS AND SYSTEMS TO DETERMINE SHAPES FOR SEMICONDUCTOR OR FLAT PANEL DISPLAY FABRICATION

BACKGROUND

The present disclosure is related to lithography, and more particularly to the design and manufacture of a surface which may be a reticle, a wafer, or any other surface, using charged particle beam lithography.

Three common types of charged particle beam lithography are unshaped (Gaussian) beam lithography, shaped charged particle beam lithography, and multi-beam lithography. In all types of charged particle beam lithography, charged particle beams shoot energy to a resist-coated surface to expose the resist.

In the production or manufacturing of semiconductor devices, such as integrated circuits, optical lithography may be used to fabricate the semiconductor devices. Optical lithography is a printing process in which a lithographic mask or photomask manufactured from a reticle is used to form patterns on a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is created the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to form patterns on a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is created the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

In optical lithography a lithographic mask or reticle comprises geometric patterns corresponding to the circuit components to be integrated onto a substrate. The patterns used to manufacture the reticle may be generated utilizing computer-aided design (CAD) software or programs. In designing the patterns, the CAD program may follow a set of predetermined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. Critical dimensions are, for instance, defined as the important widths or areas of a feature or the important space between two features or important space areas—those dimensions requiring exquisite control. Due to the nature of integrated circuit designs, many patterns in a design are repeated in different locations. A pattern may be repeated hundreds or thousands of times—each copy of the pattern is called an instance. If a design rule violation is found in such a pattern, the hundreds or thousands of violations may be reported—one for each instance of the pattern.

One goal in integrated circuit fabrication by optical lithography is to reproduce the original circuit design on a substrate by use of a reticle, in which the reticle, sometimes referred to as a mask or a photomask, is a surface which may be exposed during manufacture using charged particle beam lithography. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to form patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. Resolution enhancement technologies (RET) performed with a reticle include OPC and inverse lithography technology (ILT).

OPC may add sub-resolution lithographic features to mask patterns to reduce differences between the original physical design pattern, that is, the design, and the final created circuit pattern on the substrate. The sub-resolution lithographic features interact with the original patterns in the physical design and with each other and compensate for proximity effects to improve the final created circuit pattern. One feature that is added to improve pattern formation is referred to as a "serif". Serifs are small features that enhance precision or resiliency to manufacturing variation of printing of a particular feature. An example of a serif is a small feature that is positioned on a corner of a pattern to sharpen the corner in the final created image. Patterns that are intended to print on the substrate are referred to as main features. It is conventional to discuss the OPC-decorated patterns to be written on a reticle in terms of main features, that is features that reflect the design before OPC decoration, and OPC features, where OPC features might include serifs, jogs, sub-resolution assist features (SRAFs) and negative features. SRAFs are isolated shapes, unattached to the main feature, and are small enough not to print on the substrate, while serifs, jogs and negative features alter a main feature. OPC features are subject to various design rules, such as a rule based on the size of the smallest feature that can be created to the wafer using optical lithography. Other design rules may come from the mask manufacturing process or, if a character projection charged particle beam writing system is used to form the pattern on a reticle, from the stencil manufacturing process.

SUMMARY

In embodiments, methods for calculating a pattern to be manufactured on a substrate include inputting a physical design pattern and determining a plurality of possible neighborhoods for the physical design pattern. A plurality of possible mask designs for the physical design pattern is generated, where the plurality of possible mask designs corresponds to the plurality of possible neighborhoods. A plurality of possible patterns on the substrate is calculated, where the plurality of possible patterns on the substrate correspond to the plurality of possible mask designs. A variation band from the plurality of possible patterns on the substrate is calculated, and the physical design pattern is modified to reduce the variation band.

In embodiments, methods for calculating a pattern to be manufactured on a substrate include inputting a physical design; inputting a set of parameters for a neural network to calculate a pattern to be manufactured on the substrate; and generating a plurality of possible neighborhoods for the physical design. A plurality of patterns to be manufactured on the substrate is calculated for the physical design in each possible neighborhood of the plurality of possible neighborhoods. The neural network is trained with the calculated plurality of patterns, where the training is performed using a computing hardware processor. The set of parameters is adjusted to reduce manufacturing variation for the calculated plurality of patterns to be manufactured on the substrate.

BRIEF DESCRIPTION OF THE DRAWINGS

FIG. 14 illustrates examples of calculated mask images and generated deep learned images, in accordance with some embodiments.

DETAILED DESCRIPTION OF EMBODIMENTS

Figure 1:
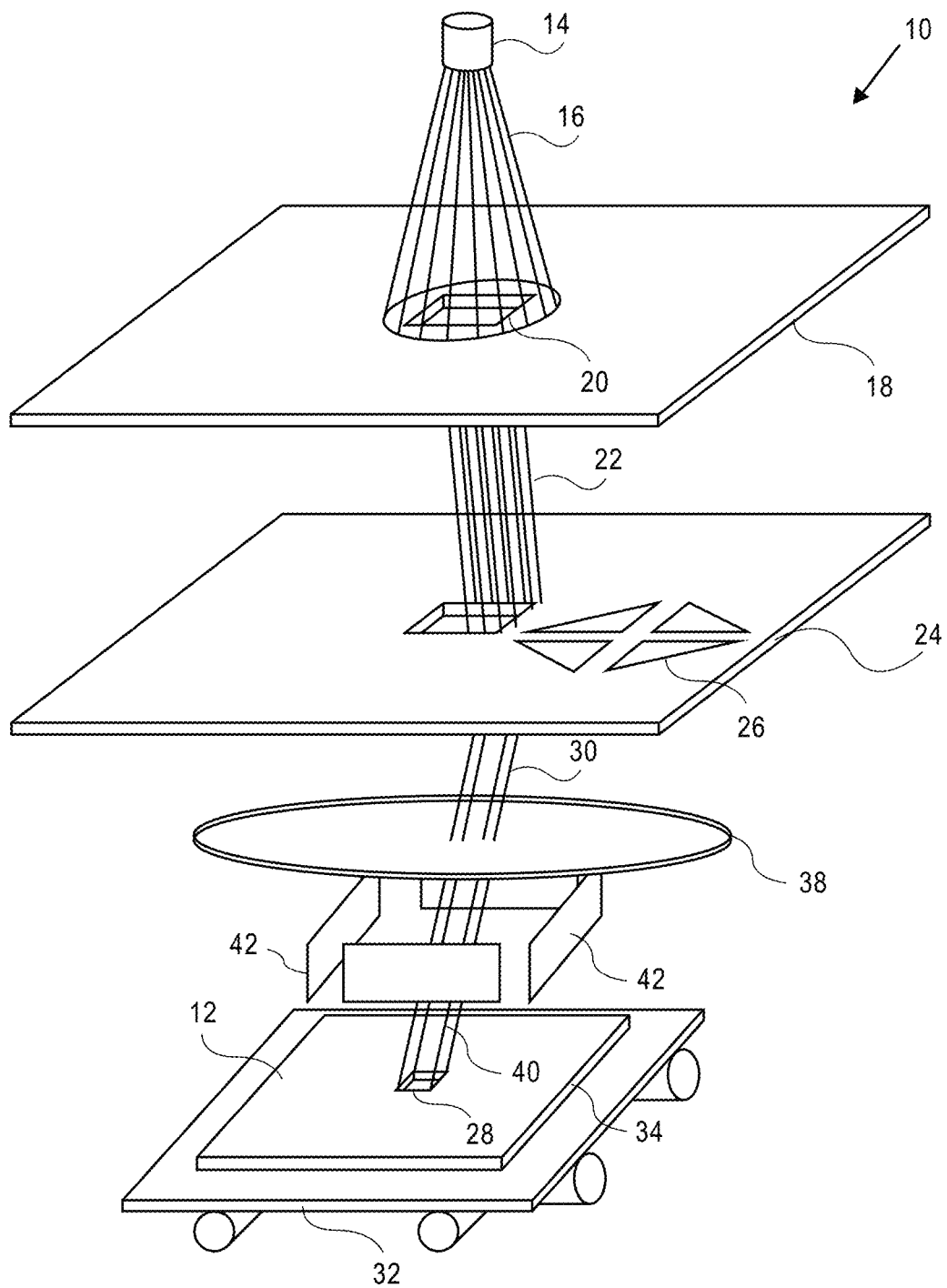
FIG. 1 illustrates an example of a variable shaped beam system, as known in the art.

The present disclosure describes methods and systems that improve the manufacturing accuracy and calculation time of patterns. Embodiments enable multiple parameters at different stages of the manufacturing process—such as the physical design, mask and substrate stages—to be modeled simultaneously. The results of multiple scenarios are output, such as in visual diagrams, so that a user can view and make changes in near real-time. Embodiments estimate variations in mask design and wafer manufacturing steps and utilize statistical methods to improve the physical design of the pattern.

A typical RET method has OPC verification to identify and correct hot spots. A hot spot is an area requiring ideal conditions to print properly and therefore is not resilient to manufacturing variation, or in some cases would not print properly even in ideal conditions. Hot spots lead to poor yield. In lithography, features that are needed on the substrate, referred to as main features, are found to print with greater fidelity and improved process window if SRAFs are added that are too small to print themselves, but nevertheless favorably affect the way nearby main features print.

However, adding OPC features, such as SRAFs, is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce identical shapes on the wafer. These slight but critical variations are important and have prevented others from being able to form reticle patterns that accurately produce desired shapes on the wafer. To quantify what is meant by slight variations, a typical slight variation in OPC decoration from neighborhood to neighborhood might be 5% to 80% of a main feature size. When these OPC variations produce substantially identical patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range.

Inverse Lithography Technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. These patterns have proven to be impractical for variable shaped beam (VSB) mask writing machines with conventional fracturing because very many VSB shots are required to expose the curvilinear patterns. Rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. Mask write times are a critical business factor, and VSB writing time scales with the number of VSB shots that need to be printed. Model-based mask data preparation using overlapping shots can significantly reduce the write time impact of curvilinear ILT mask designs. However, in general curvilinear shapes take longer to write than rectilinear shapes.

Multi-beam writing eliminates the need to perform rectilinearization to convert the curvilinear shapes for VSB writing. But mask printability and resilience to manufacturing variation are still important considerations for mask shapes output by ILT. For example, shapes that are too small or too close to each other, or have too sharp a turn in the contours of the shapes make it too difficult to make the masks reliably, especially across manufacturing variation. The remaining problem with ILT is the huge computational demands of dense simulations of full mask layers of full designs, particularly full-reticle sized designs, which for semiconductor manufacturing is typically around 3.0 cm×2.5 cm in wafer dimensions.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to form the pattern 28 on to a substrate (not illustrated).

Figure 2:
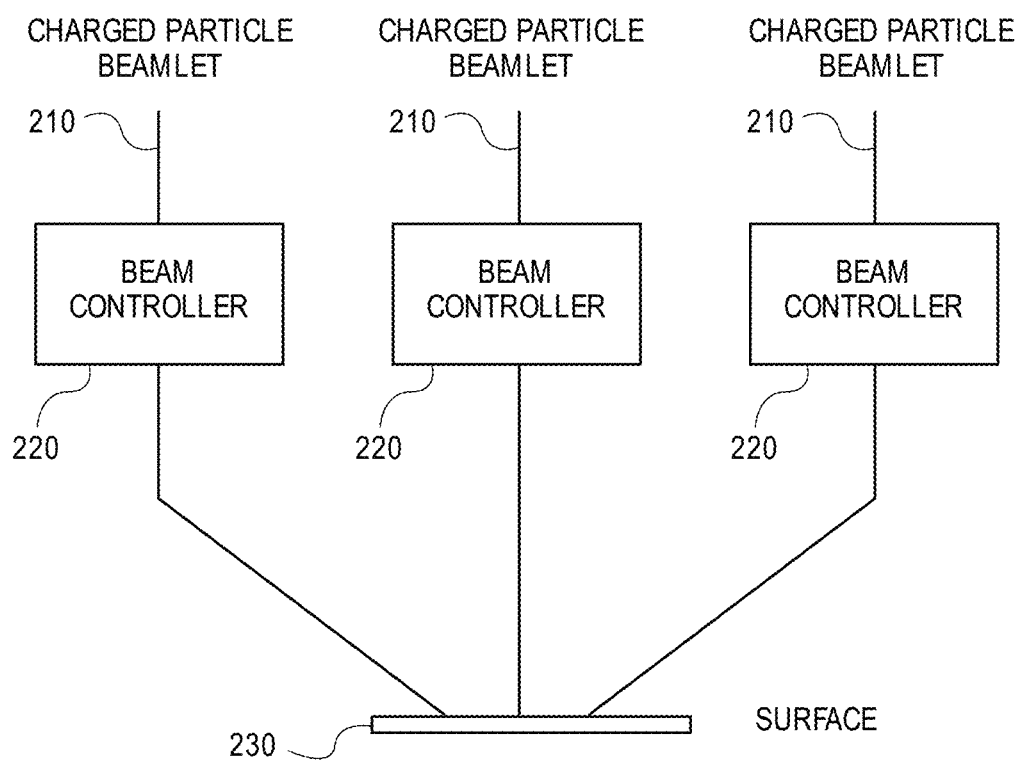
FIG. 2 illustrates an example of an electro-optical schematic diagram of a multi-beam exposure system, as known in the art.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

Figure 3A:
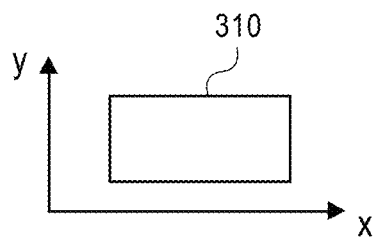
FIG. 3A illustrates an example of a rectangular shot, as known in the art.
Figure 3B:
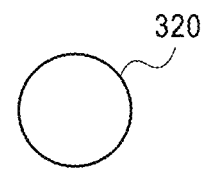
FIG. 3B illustrates an example of a circular character projection shot, as known in the art.
Figure 3C:
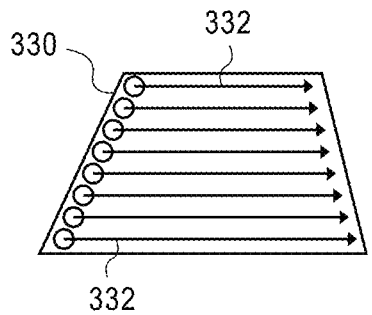
FIG. 3C illustrates an example of a trapezoidal shot, as known in the art.
Figure 3D:
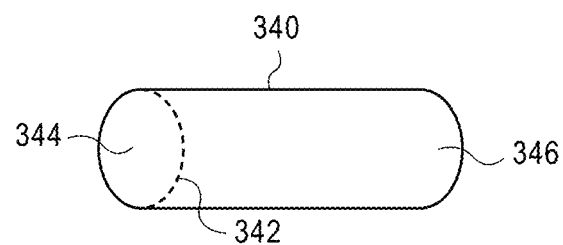
FIG. 3D illustrates an example of a dragged shot, as known in the art.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIGS. 3A-3F illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
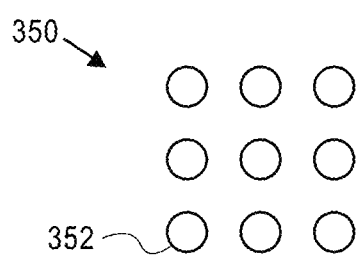
FIG. 3E illustrates an example of a shot which is an array of circular patterns, as known in the art.
Figure 3F:
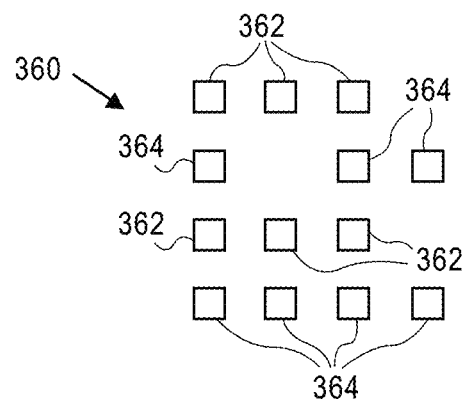
FIG. 3F illustrates an example of a shot which is a sparse array of rectangular patterns, as known in the art.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

There are a number of technologies used for forming patterns on a reticle, including using optical lithography or charged particle beam lithography. The most commonly used system is the variable shaped beam (VSB), where, as described above, doses of electrons with simple shapes such as Manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count or higher accuracy or both. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Figure 4:
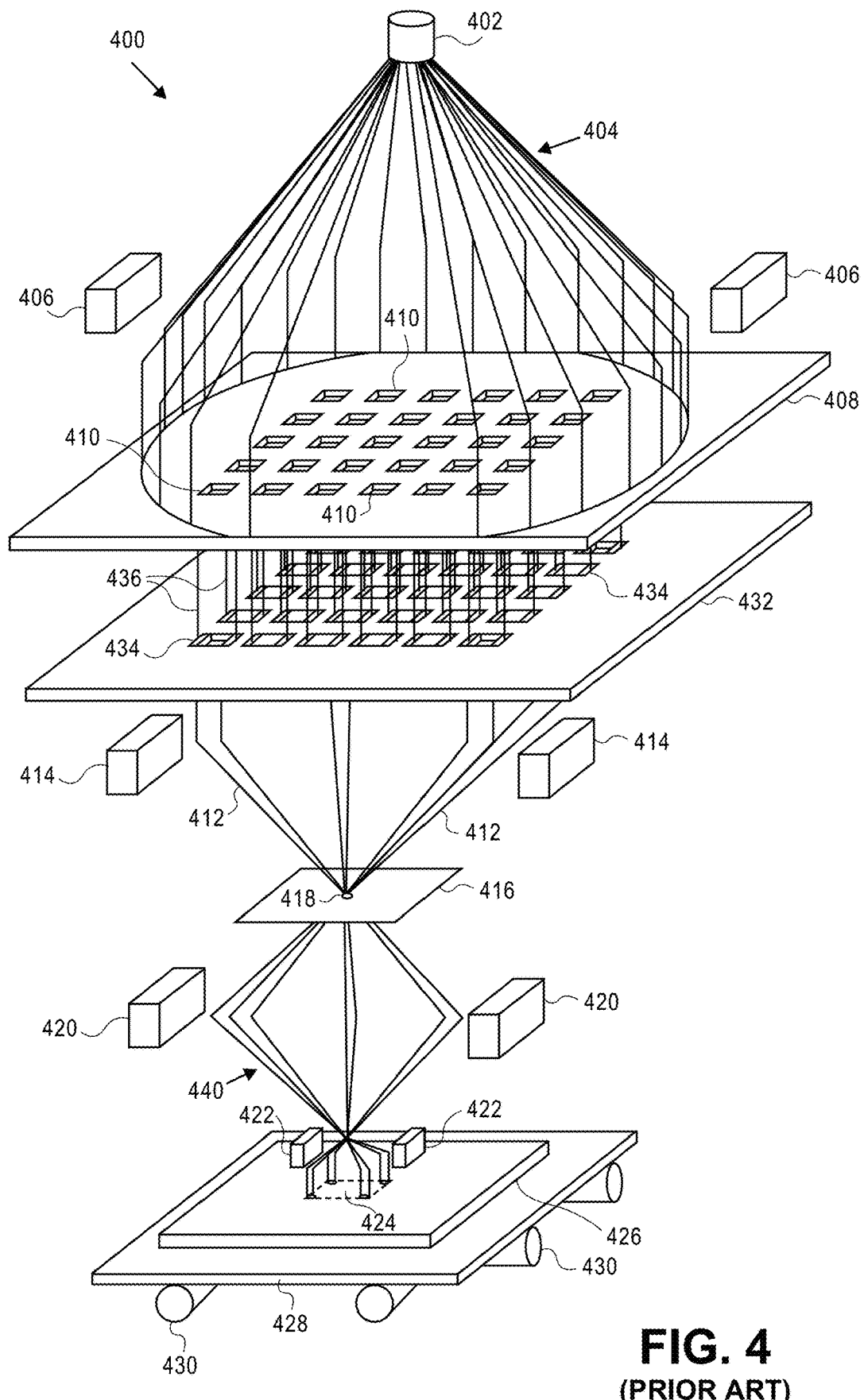
FIG. 4 illustrates an example of a multi-beam charged particle beam system, as known in the art.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled. The area the beam strikes the surface may encompass a portion of an entire pixel.

A multi-beam system's ability to modify the dose of individual pixels to bias an edge of a shape is disclosed in "Bias Correction for Lithography," U.S. Pat. No. 10,444, 629, owned by the assignee of the present patent application. U.S. Pat. No. 10,444,629 also discloses improving dose margin so that an edge is less susceptible to manufacturing variation. This method for modifying dose pixel by pixel can be referred to as pixel level dose correction (PLDC).

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group. In some embodiments, stage 428 may be moved in a single direction across the entire area of exposure, to expose a portion of the entire area, the portion being called a stripe. The entire area of exposure is therefore exposed as a plurality of stripes. In some embodiments, stage 428 moves in opposite directions on adjacent or alternate stripes.

Other types of multi-beam systems may create a plurality of unshaped beamlets 436, such as by using a plurality of charged particle beam sources to create an array of Gaussian beamlets.

Referring again to FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 14 and the exposure time for each shot. Typically, the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems, all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

The mechanisms within electron beam writer systems have a relatively coarse resolution for calculations. As such, mid-range corrections such as may be required for EUV masks in the range of 2 μm cannot be computed accurately by current electron beam writer systems.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably.

Figure 5A:
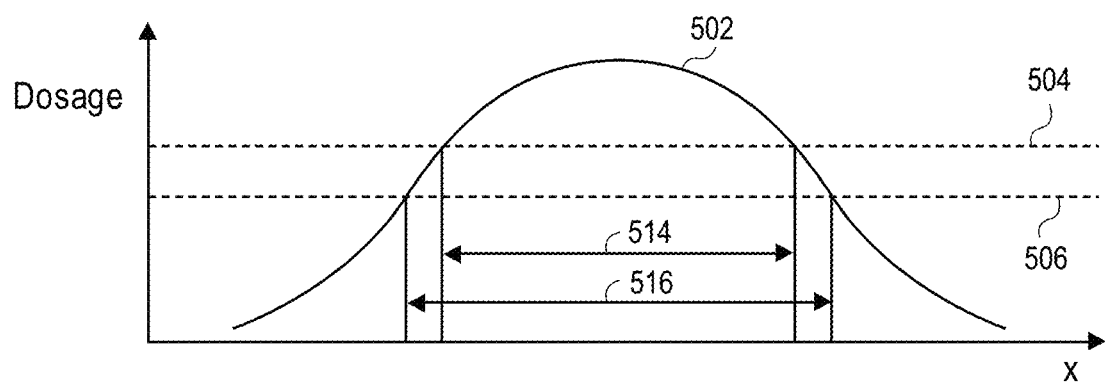
FIG. 5A illustrates an example of a cross-sectional dosage graph, showing registered pattern widths for each of two resist thresholds, as known in the art.
Figure 5B:
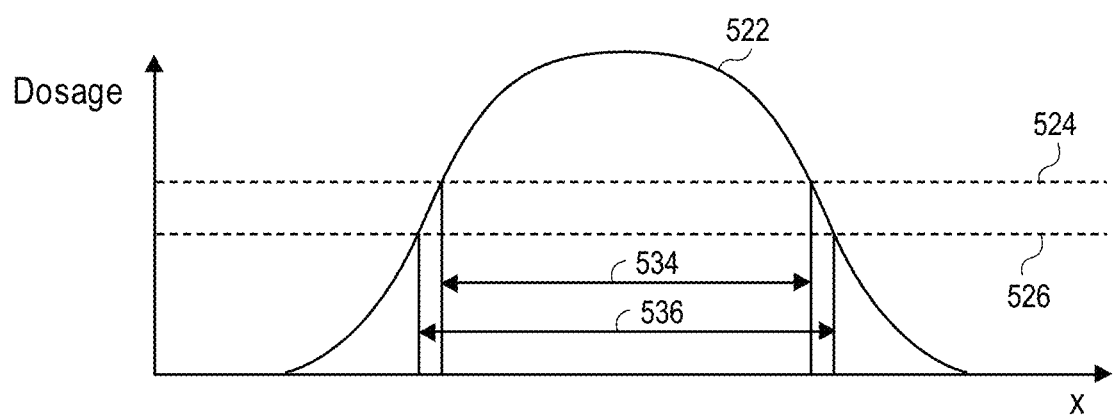
FIG. 5B illustrates an example of a cross-sectional dosage graph similar to FIG. 5A, but with a higher dosage edge slope than in FIG. 5A, as known in the art.

FIGS. 5A-B illustrate how critical dimension variation can be reduced by exposing the pattern on the resist so as to produce a relatively high edge slope in the exposure or dosage curve, such as is described in U.S. Pat. No. 8,473, 875, entitled "Method and System for Forming High Accuracy Patterns Using Charged Particle Beam Lithography," which is owned by the assignee of the present patent application. FIG. 5A illustrates a cross-sectional dosage curve 502, where the x-axis shows the cross-sectional distance through an exposed pattern—such as the distance perpendicular to two of the pattern's edges—and the y-axis shows the dosage received by the resist. A pattern is registered by the resist where the received dosage is higher than a threshold. Two thresholds are illustrated in FIG. 5A, illustrating the effect of a variation in resist sensitivity. The higher threshold 504 causes a pattern of width 514 to be registered by the resist. The lower threshold 506 causes a pattern of width 516 to be registered by the resist, where width 516 is greater than width 514. FIG. 5B illustrates another cross-sectional dosage curve 522. Two thresholds are illustrated, where threshold 524 is the same as threshold 504 of FIG. 5A, and threshold 526 is the same as threshold 506 of FIG. 5A. The slope of dosage curve 522 is higher in the vicinity of the two thresholds than is the slope of dosage curve 502. For dosage curve 522, the higher threshold 524 causes a pattern of width 534 to be registered by the resist. The lower threshold 526 causes a pattern of width 536 to be registered by the resist. As can be seen, the difference between width 536 and width 534 is less than the difference between width 516 and width 514, due to the higher edge slope of dosage curve 522 compared to dosage curve 502. If the resist-coated surface is a reticle, then the lower sensitivity of curve 522 to variation in resist threshold can cause the pattern width on a photomask manufactured from the reticle to be closer to the target pattern width for the photomask, thereby increasing the yield of usable integrated circuits when the photomask is used to form a pattern on a substrate such as a silicon wafer. Similar improvement in tolerance to variation in dose for each shot is observed for dose curves with higher edge slopes. Achieving a relatively higher edge slope such as in dosage curve 522 is therefore desirable.

Figure 6:
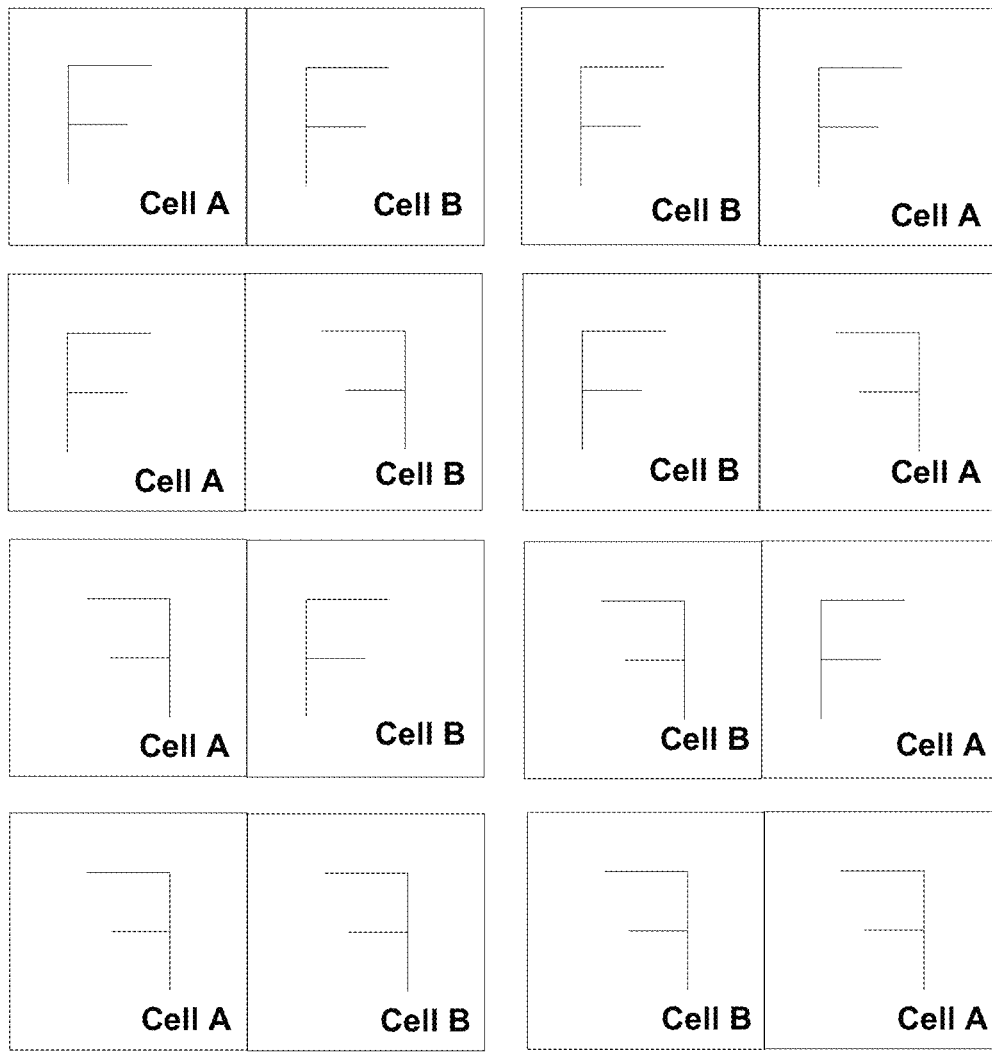
FIG. 6 illustrates an example of orientation variation for a standard cell design, as known in the art.

A design cell (such as a memory cell or standard cell from a library) in semiconductor manufacturing is an abstract representation of an electronic component in a physical layout. A cell-based design methodology allows designers to reuse components in relatively simple to complex designs. A cell may be comprised of several layers containing shapes varying in size and orientation. A cell, or set of shapes from a given layer within a cell, placed in relative isolation with no neighboring shapes near it in a design, will result in a different pattern on a substrate than when the cell is placed with other cells and/or shapes in its immediate neighborhood, i.e., with different neighbor shapes in close proximity on the same layer. FIG. 6 is shown as an example of a standard cell containing two cells, cell A and cell B, in various legal orientations. Because of the proximity of the geometries in cells adjacent to each other (i.e., in the same neighborhood), each orientation may result in a variation of a mask design calculated for each cell. As stated earlier, OPC will vary to account for optical diffraction and the optical interaction of features with proximate features. In a PEC refinement step, shot dosages are adjusted as needed for various long-range effects for each neighborhood.

Manufacturing process variations and neighborhood-induced variations have a large impact on design performance and manufacturing reliability making it desirable to allow circuit and/or mask designers to visualize the effects of the different variation sources in the context of their actual design. For example, process variations can cause the width of a pattern on the photomask to vary from the intended or target width. The pattern width variation on the photomask will cause a pattern width variation on a wafer which has been exposed using the photomask in an optical lithographic process. The sensitivity of the wafer pattern width to variations in photomask pattern width is called mask edge error factor, or MEEF. In an optical lithography system using a 4× photomask, where the optical lithographic process projects a 4× reduced version of the photomask pattern onto the wafer, a MEEF of 1, for example means that for each 1 nm error in pattern width on a photomask, the pattern width on the wafer will change by 0.25 nm. A MEEF of 2 means that for a 1 nm error in photomask pattern width, the pattern width on the wafer will change by 0.5 nm. For the smallest integrated circuits processes, MEEF may be greater than 2. With a good visualization/understanding of these variation sources/effects, a designer can modify the design itself (or the shapes comprising the design) to be more robust to such variation.

Figure 7:
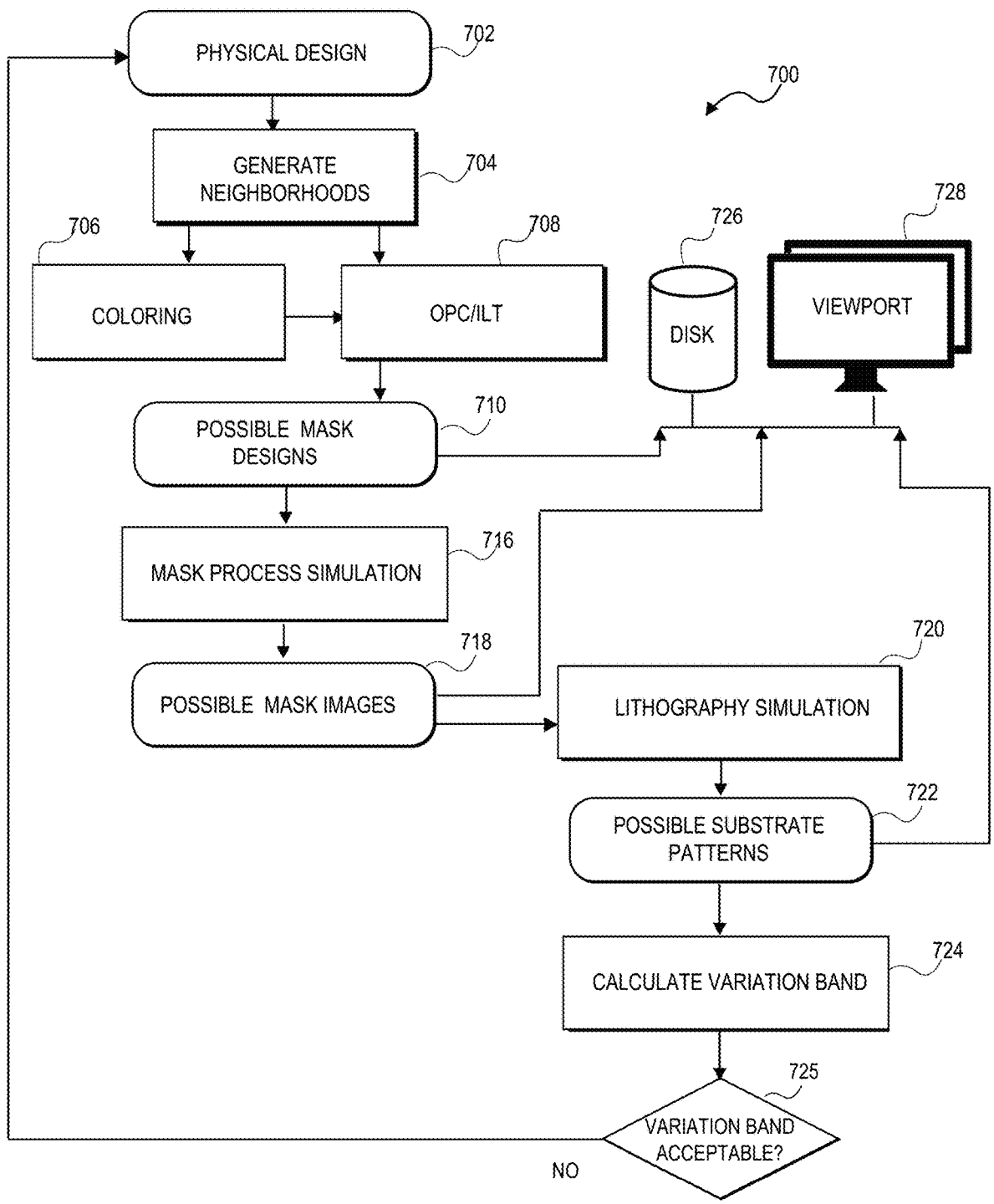
FIG. 7 illustrates an example of a physical design flow, in accordance with some embodiments.

FIG. 7 is a conceptual flow diagram 700 for calculating a pattern to be manufactured on a substrate such as a silicon wafer, in accordance with some embodiments. In a first step, a physical design pattern 702, such as a physical design of an integrated circuit, is input. In one embodiment, a pattern to be manufactured on the substrate may be calculated from the physical design pattern. These calculations can include determining manufacturable shapes for the logic gates, transistors, metal layers, and other items that are required to be found in a physical design such as that of an integrated circuit. The physical design may be rectilinear, piecewise linear, partially curvilinear, or completely curvilinear. In particular, curvilinear patterns are extremely compute-intensive, and thus being able to optimize patterns by calculating the cumulative effects of variations from multiple manufacturing stages as in the present embodiments is extremely valuable.

Step 704 involves generating a plurality of possible neighborhoods for the physical design. In some embodiments the physical design pattern is a portion of an entire design, and the plurality of possible neighborhoods generated in step 704 is a plurality of actual neighborhoods used for the physical design pattern. Neighborhood variations can be synthesized. For example, one way may be to randomly place a cell in all the possible neighborhoods it might eventually end up in, i.e. surrounded by the various neighboring cells it is most likely to be surrounded by in a real circuit design. In some embodiments the portion of the physical design pattern is an instance of the physical design pattern and the plurality of possible neighborhoods includes all the neighborhoods of each instantiation. Instances of the cell of interest, in its various legal orientations, would therefore be placed alongside various orientations of various neighbor cells, with instances of those various neighbors placed above/below, to left of or to right of, and with various offsets in the placements. In some embodiments the portion of the entire design is a standard cell design containing a plurality of standard cells, and the plurality of possible neighborhoods includes all legal orientations of the standard cells.

In step 706, a composite of substrate layers, some of which are separated into mask layers, may be created from the physical design. This step also includes what is sometimes referred to as the coloring step, or colorization, where each feature on a reticle layer is colored to reflect the assignment of a feature to a particular mask layer. The colorization step 706 may be performed on the physical design pattern prior to optical proximity correction (OPC). In a step 708, OPC may be performed on the physical design pattern to produce a plurality of possible mask designs 710, with each mask design in the plurality of mask designs corresponding to a plurality of possible neighborhoods generated in step 704. The plurality of possible mask designs 710 may be combined to create a nominal mask design with variation. Conventionally, the nominal mask design can be determined using a nominal dose, such as 1.0 and calculating a nominal contour of a mask design at a threshold, such as 0.5. In one embodiment the nominal contour of the mask design is calculated from the plurality of possible mask designs 710. The variation may be calculated for all possible neighborhoods generated in step 704.

In an embodiment of this disclosure, the OPC step 708 may comprise ILT which creates ideal curvilinear ILT patterns. In other embodiments ILT with rectilinearization of the curvilinear patterns may be used.

OPC features or ILT patterns for the same physical design pattern will vary from neighborhood to neighborhood. A plurality of possible mask images may be calculated from the plurality of possible mask designs in each of the many possible neighborhoods. In an embodiment, a nominal mask design may be calculated from the calculated OPC features or ILT patterns in many possible neighborhoods. In some embodiments the plurality of possible mask designs may be stored in a file system 726 which may be on disk or in memory or any other storage device.

In some embodiments, mask process simulation step 716 may include mask data preparation (MDP) which prepares the mask design for a mask writer. This step may include "fracturing" the data into trapezoids, rectangles, or triangles. Mask Process Correction (MPC) may also be included in step 716. MWC geometrically modifies the shapes and/or assigns dose to the shapes to make the resulting shapes on the mask closer to the desired shape. MDP may use as input the possible mask designs 710 or the results of MPC. MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. Pixel-level dose correction (PLDC) may also be applied in step 716. In other embodiments, a VSB shot list or exposure information for multi-beam may be generated to produce a plurality of possible mask images 718 from the possible mask designs 710. In some embodiments a set of VSB shots is generated for a calculated mask pattern in the plurality of calculated mask patterns. In some embodiments, MPC and/or MDP may be performed on the possible mask designs 710.

In step 716, calculating a plurality of possible mask images 718 may comprise charged particle beam simulation. In some embodiments the plurality of possible mask images may be stored on the file system 726. Effects that may be simulated include forward scattering, backward scattering, resist diffusion, Coulomb effect, fogging, loading and resist charging. Step 716 may also include mask process simulation where the effects of various post-exposure processes are calculated. These post-exposure processes may include resist baking, resist development and etch. When charged particle beam simulation is performed for the mask on any given layer, the simulation may be performed over a range of process variations to establish manufacturability contours for the mask itself. The contours may extend from a nominal contour, where the nominal contour may be based on a pattern produced at a particular resist threshold, for example, at a threshold of 0.5. In some embodiments calculating a given percentage difference in exposure dose, for example, +/−10% dose variation creates a mask image with variation for displaying in a viewport 728 comprising upper and lower bounds of a process variation band surrounding the nominal contour. In some embodiments, the plus and minus variations may differ from each other, for example +10% and −8%. Charged particle beam simulation and mask process simulation may be performed separately from each other in step 716.

In a substrate simulation step 720, calculating possible substrate patterns 722 may comprise lithography simulation using the calculated mask images 718. A plurality of possible patterns on the substrate may be calculated from the plurality of mask images. Each pattern in the plurality of possible patterns on the substrate corresponds to a set of manufacturing variation parameters. Calculating a substrate pattern from a calculated mask image is described in U.S. Pat. No. 8,719,739, entitled "Method and System for Forming High Accuracy Patterns Using Charged Particle Beam Lithography", which is owned by the assignee of the present patent application. The plurality of possible patterns on the substrate 722 may be combined to create a nominal substrate pattern with variation. In some embodiments, sources of substrate pattern variation will include some given variation in exposure (dose) in combination with some given variation in depth of focus, for example +/−10% in exposure, and +/−30 nm in depth of focus. In some embodiments, the plus and minus variations may differ from each other, for example +5%/−7% and 30 nm/−28 nm. Conventionally, statistical methods are used to create a 3-sigma variation from the nominal contour. The variation comprises a lower bound 3-sigma less than the nominal contour for a minimum, and an upper bound 3-sigma greater than the nominal contour for a maximum. In some embodiments instead of calculating the 3-sigma variation extending from the nominal contour, a mask image with variation is created by combining a plurality of mask images 718 comprising process variation bands with a lower bound and an upper bound. In some embodiments, the substrate patterns can be formed on a wafer using an optical lithographic process using the mask image with variation. In some embodiments the plurality of possible patterns on the substrate may be stored in the file system 726. In some embodiments, wafer process simulation is performed on the substrate patterns. Wafer process simulation may include simulation of resist baking, resist development and etch. Lithography simulation 720 and wafer process simulation may be separate steps, optionally each step having process variation. In other embodiments, lithography simulation 720 may comprise Flat Panel Display (FPD) simulation, Microelectromechanical Systems (MEMS) simulation, other process simulation or anything else that could be manufactured on a substrate.

In each of the steps in FIG. 7, variation is statistically cumulative and will take into account variation from previous steps such that the substrate patterns in the final step will have incorporated not only variations in determining possible patterns on a substrate 722 but also variations in mask process 716 and mask design 710. A process variation band is calculated in step 724 from the possible substrate patterns. To make the calculations of the many possible combinations of variations more efficient, the variations may be accumulated using insights in how certain variations and pattern parameters might affect each other. For instance, rather than simply feeding the minimum and maximum 3-sigma values from one step into the next, a worst case variation that is fed into the next step could take into account the distance of one pattern from another. This is because features in closer to proximity to each other affect each other more than features that are farther apart. Because of the impact these variations have on design performance and manufacturing reliability, it may be desirable to allow designers to visualize the effects of the different variation in the context of an actual circuit design. Visualizing the effects of the statistically cumulative variation as predicted on the substrate can be shown after calculating a variation band in step 724, or by visualizing the effects of the different variations in each step. If the variation is unacceptable in step 725, a designer can modify the physical design 702 to create an improved physical design to insure the improved physical design is more robust to manufacturing variation. Modifications to the physical design can include modifying the possible neighborhoods of the physical design or modifying the coloring, e.g., modifying the shape assignment to any particular layer. In design environments where curvilinear designs are permissible, providing a computed nominal contour as the new manufacturable physical design will have the benefit of having reduced manufacturing variation. This is because designs that can be manufactured will have less variation than designs that cannot be manufactured (such as shapes with 90 degree corners which are inherently not manufacturable). Note that manufacturing variation predicted in the above steps would need to be repeated with the improved physical design to estimate the manufacturing variation of the modified physical design. In some embodiments variation in each step may be shown simultaneously in a single viewport 728 with the nominal contour with variation overlaid with the corresponding design, image or pattern; or the variation may be shown in multiple viewports 728.

Calculating a pattern to be manufactured on a substrate may comprise calculating a plurality of substrate patterns from a plurality of mask images which are calculated from a plurality of mask designs. These calculations can take significant time and even when pre-calculated and stored can still take time to retrieve. In an embodiment, calculating the pattern to be manufactured on a substrate may be learned in a neural network. A neural network is a framework of machine learning algorithms that work together to predict patterns based on a previous training process. Embodiments include training a neural network to calculate a pattern to be manufactured on a substrate with input physical design 702 and any combination of one or more outputs as depicted in FIG. 7, possible mask designs 710, possible mask images 718, or possible substrate patterns 722. Step 725 may also involve adjusting a set of parameters for the neural network to reduce manufacturing variation for the calculated plurality of patterns, as part of the process of training the neural network. The training of the neural network may be performed using a computing hardware processor. Such training achieves similar goals as in previous embodiments, however once trained, the transformation in the trained neural network may be much faster, such as 10× faster, than with simulation alone. In one embodiment, the trained neural network or group of trained neural networks can transform a physical design pattern to a pattern to be manufactured on the substrate. That is, in some embodiments calculating the pattern on the substrate comprises a neural network with a physical design as input.

Figure 8:
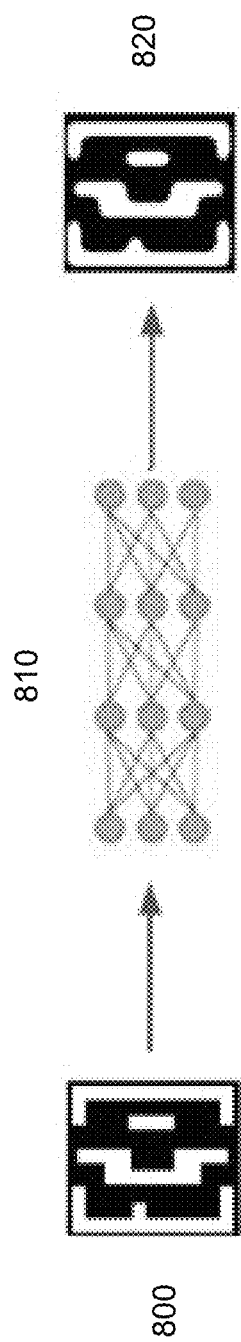
FIG. 8 illustrates an example single input/output neural network, in accordance with some embodiments.

In one embodiment, each of the outputs 710, 718 and 722 may be generated by trained neural networks. Digital twins replicate physical entities. Conventionally, digital twins model the properties, conditions and attributes of their real-world counterparts. This may be accomplished through rigorous simulation. For the present application, simulation results may be used to train a neural network, resulting in a neural network digital twin that performs much faster than with simulation data. A neural network digital twin trained with simulated data, at any stage, or combinations of stages, may be used to perform an image-to-image transformation. In one embodiment a deep convolutional neural network (CNN) architecture such as a Fully Convolutional Network (FCN), for example, may be trained with the paired image data representing the input and output respectively of any of the calculation steps in FIG. 7. In FIG. 8 an image 800 representing a physical design or CAD data is provided as input to a CNN 810, such as a FCN, and image 820 representing manufactured output shapes is generated by CNN 810. Other neural network architectures such as a U-Net, which is a type of FCN, or Generative Adversarial Networks (GANs) may also be used. In other embodiments, neural networks may be trained to generate OPC/ILT features or shapes for various neighborhoods, generate images optimized for mask process correction or data preparation, calculate patterns on a substrate, or any combination of steps. In one embodiment, any one or more of the steps in FIG. 7 may be combined and substituted with a digital twin, neural network or group of digital twins or neural networks.

In embodiments, methods for calculating a pattern to be manufactured on a substrate include inputting a physical design pattern 702, determining a plurality of possible neighborhoods (step 704) for the physical design pattern, and generating a plurality of possible mask designs 710 for the physical design pattern, wherein the plurality of possible mask designs corresponds to the plurality of possible neighborhoods. The methods also include calculating a plurality of possible patterns on the substrate 722, wherein the plurality of possible patterns on the substrate correspond to the plurality of possible mask designs; calculating a variation band (step 724) from the plurality of possible patterns on the substrate; and modifying the physical design pattern (loop from step 725 to physical design 702) to reduce the variation band.

In some embodiments, methods also include calculating a plurality of calculated mask images (step 718) from the plurality of possible mask designs. In some embodiments, calculating the plurality of possible mask images comprises charged particle beam simulation (step 716). In some embodiments, modifying the physical design pattern comprises modifying the plurality of possible neighborhoods (step 704) of the physical design pattern. In some embodiments, the variation band of step 724 corresponds to a set of manufacturing variation parameters. In some embodiments, the variation band of step 724 comprises a process variation with a lower bound and an upper bound surrounding a nominal substrate pattern. In some embodiments, methods also include performing a coloring step 706 separating shapes of the physical design pattern into layers, where in further embodiments modifying the physical design pattern includes modifying the coloring step.

In some embodiments, the physical design 702 comprises an optical proximity correction (step 708) of the physical design pattern. In some embodiments, determining the plurality of possible neighborhoods 704, generating the plurality of possible mask designs 710 or calculating the plurality of possible patterns on the substrate 722 comprises using a neural network. In some embodiments, calculating the plurality of possible patterns on the substrate comprises lithography simulation (step 720).

In some embodiments, the physical design pattern 702 comprises a portion of an entire design, and method further comprises determining a set of actual neighborhoods (in step 704) in which the physical design pattern is used in the entire design. The portion of the entire design may be an instance of the physical design pattern and the plurality of possible neighborhoods includes all neighborhoods of each instantiation.

The U-Net application, such as a FCN, may be used for the prediction of process variability bands associated with semiconductor manufacturing. The original U-Net architecture was deployed for a bio-medical image segmentation problem. In the original U-Net model architecture, each layer features a multi-channel feature map with a number of channels varying at each layer. At the final layer a 1×1 convolution is used to map each 64-component feature vector to the desired number of classes. In total a typical network has 23 convolutional layers.

Figure 9:
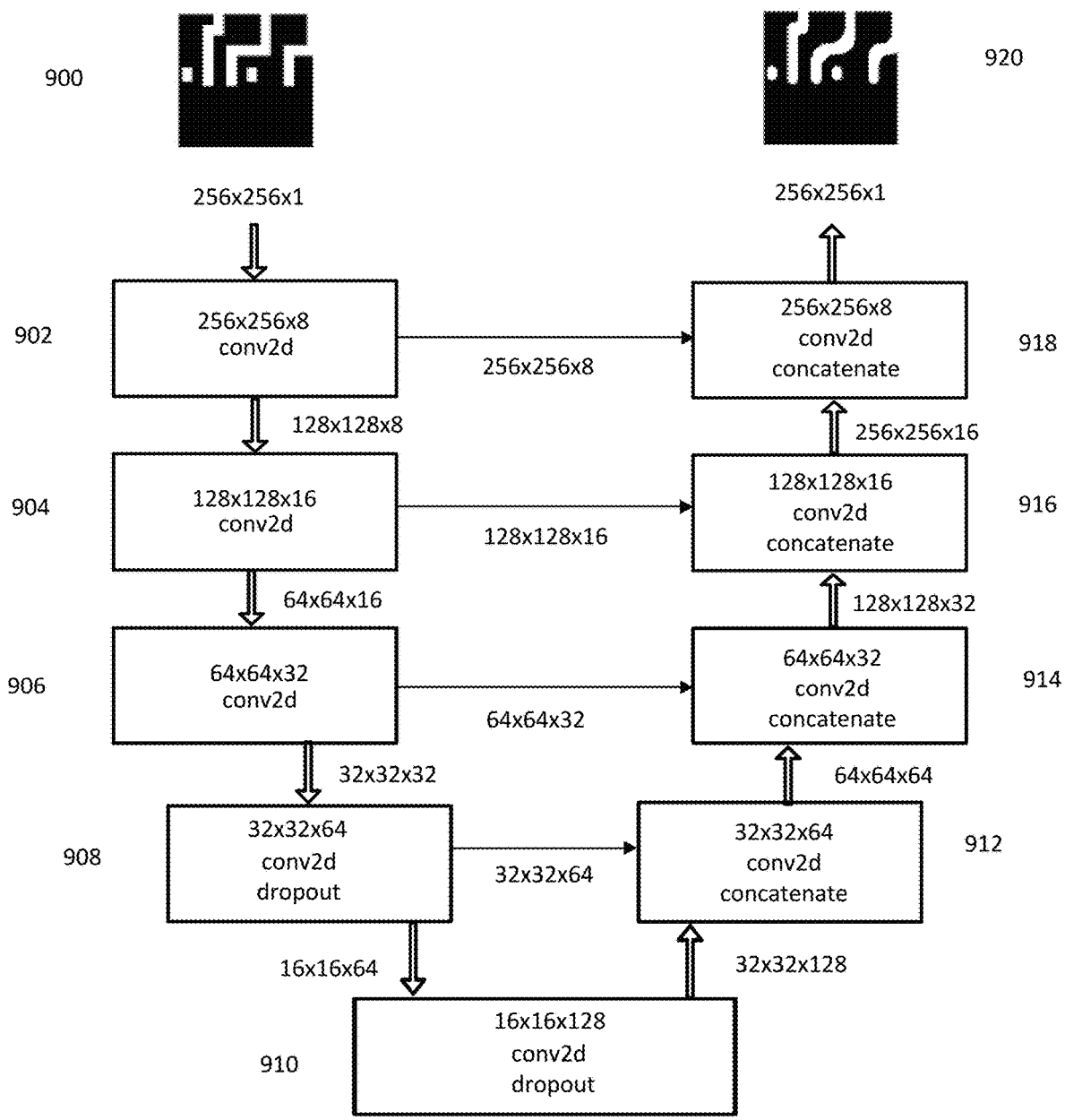
FIG. 9 illustrates details of a single input/output neural network, in accordance with some embodiments.

In one embodiment, the main neural network architecture for a FCN is essentially an encoder-decoder network as illustrated in FIG. 9, in which the encoding side on the left side and bottleneck layer 910 guide the model to learn a low dimensional encoding of the input image 900. The decoder network comprising layers 912, 914, 916 and 918 then decodes that low-dimensional representation of the image back to the full output resolution, and both sides cooperate to learn the transformation from the input image 900 to the output image 920 during training. The copy and crop operations indicated by the horizontal arrows going from encoder layers their corresponding decoder layers act as skip connections which provide additional information from the encoder side of the network and are concatenated with the information on the decoder side to help localize information in the x, y space.

When the input image is too large to be processed at once, it may be split into a collection of image tiles. The image tiles may overlap each other. Each of the smaller tiles may then be processed by the network, and the output tiles collected and re-assembled into the final output image. To reduce artifacts at tile boundaries, the FCN may also include a halo of neighboring pixels. The halo may overlap with adjacent tiles and may be used to recompose the large input image.

In a semiconductor manufacturing application the inputs 900 to the neural network represent an input image, or tiles from an input image representing the design intent—i.e., what is intended to be manufactured, assuming an 'ideal' rather than realistic manufacturing process. In an embodiment, the output image 920 represents what will actually be manufactured by the realistic manufacturing process, in which sharp corners will be rounded, small squares will be manufactured as circles or ellipses, etc. A set of model weights are determined and after training of the FCN on semiconductor manufacturing image data, the model weights will be significantly different from those used in other applications.

In one embodiment, the FCN architecture illustrated in FIG. 9, may be a multi-resolution U-Net which may have a reduced initial number of filters from 64 to 8 in the first layer 902, continuing with a filter doubling after each max pooling operation in each encoder layer 902, 904, 906, 908 and bottleneck layer 910. This has the effect of greatly reducing the overall number of trainable parameters for the network, while preserving a sufficient level of accuracy for the semiconductor manufacturing application. In another embodiment there may be 16 filters in the first layer 902. The last encoder layer 908 and the bottleneck layer 910 may each employ dropout regularization. In an embodiment, the input and output tile sizes may be for example 256×256 pixels (with an inner core tile of 128×128 surrounded by a halo 64 pixels wide). In another embodiment, the network may be further altered by removing some of the layers (shorter U depth), or by adding additional layers (deeper U), as necessary for accuracy. In another embodiment, rather than doubling the number of filters after each down sampling (max pooling) or up sampling convolution, a different ratio may be used. In one embodiment, a fixed ratio (such as 2.0) may be used at each layer, and in an alternative embodiment, a different, layer-specific ratio may be used at each layer. For example, the ratio may progressively increase as it gets lower and closer to the bottom bottleneck layer of the U shape, and thereafter correspondingly decrease again as it proceeds away from the bottleneck layer and ascends towards the output. These ratios and other network parameters may be tuned during the training phases. That is, an initial set of parameters may be input for the neural network, and the set of parameters may be adjusted as the neural network is trained. In an embodiment, the tuning may be repeated for each different manufacturing process, and/or for each different layer in a manufacturing process.

In one embodiment, the network has a single input and a single output, representing the manufactured output image corresponding to a single set of process conditions, such as a process corner. The input to the network consists of an image corresponding to the Computer Aided Design (CAD) data (a tile from the physical design drawn by the circuit designer), and the output consists of an image corresponding to the accordingly manufactured silicon for that unique set of process conditions.

Figure 10:
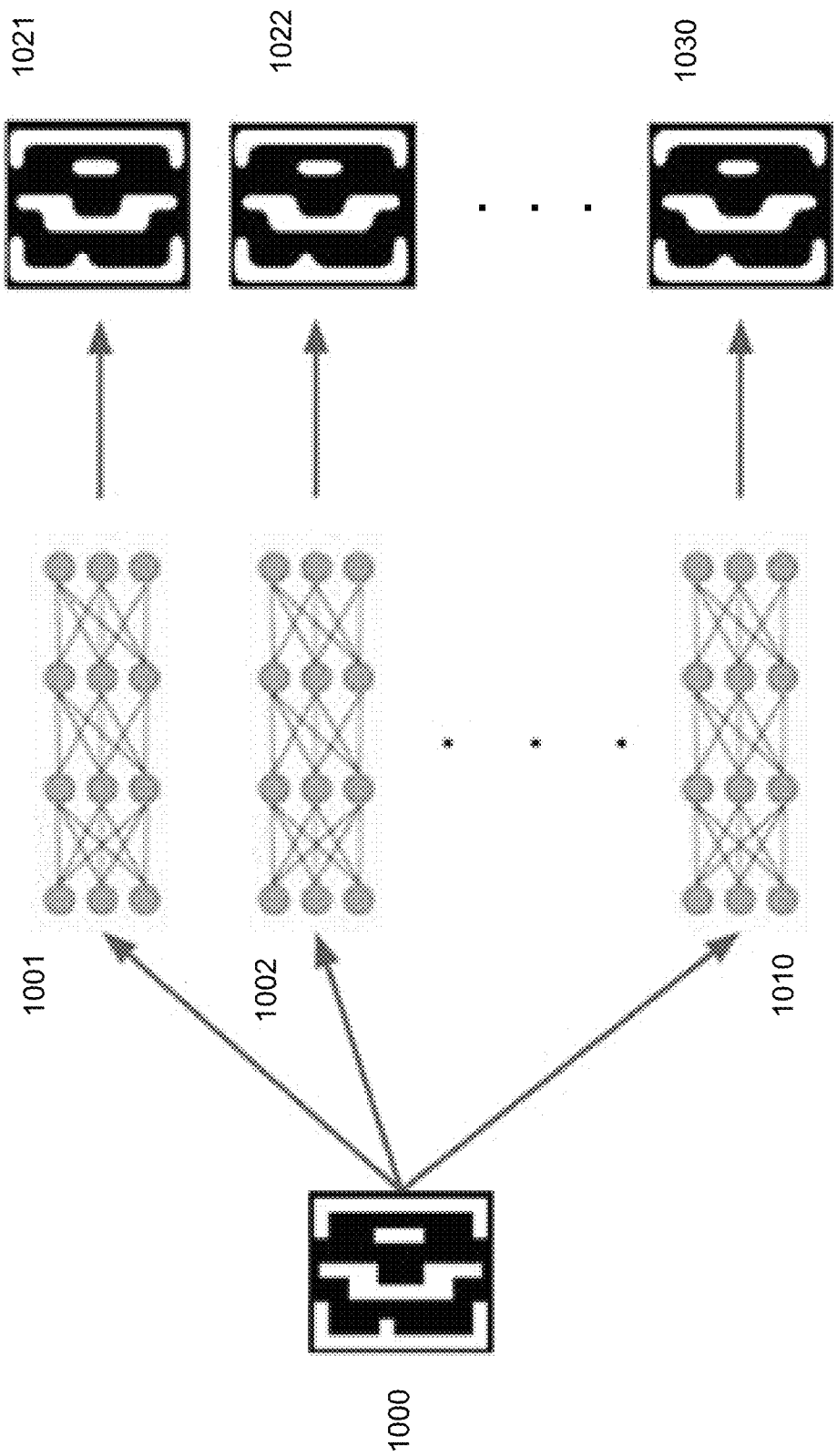
FIG. 10 illustrates an example multiple input/output neural network, in accordance with some embodiments.

In another embodiment, multiple sets of process conditions may be represented via multiple copies of the single-output network as shown in FIG. 10, with one network per unique set of process conditions. Each of these single-output networks 1001, 1002 through 1010, may be trained in parallel. After training, each of these networks may be used to infer the output for that unique set of process conditions 1021, 1022 through 1030; i.e., that particular process corner, for a given CAD data input image 1000.

Figure 11:
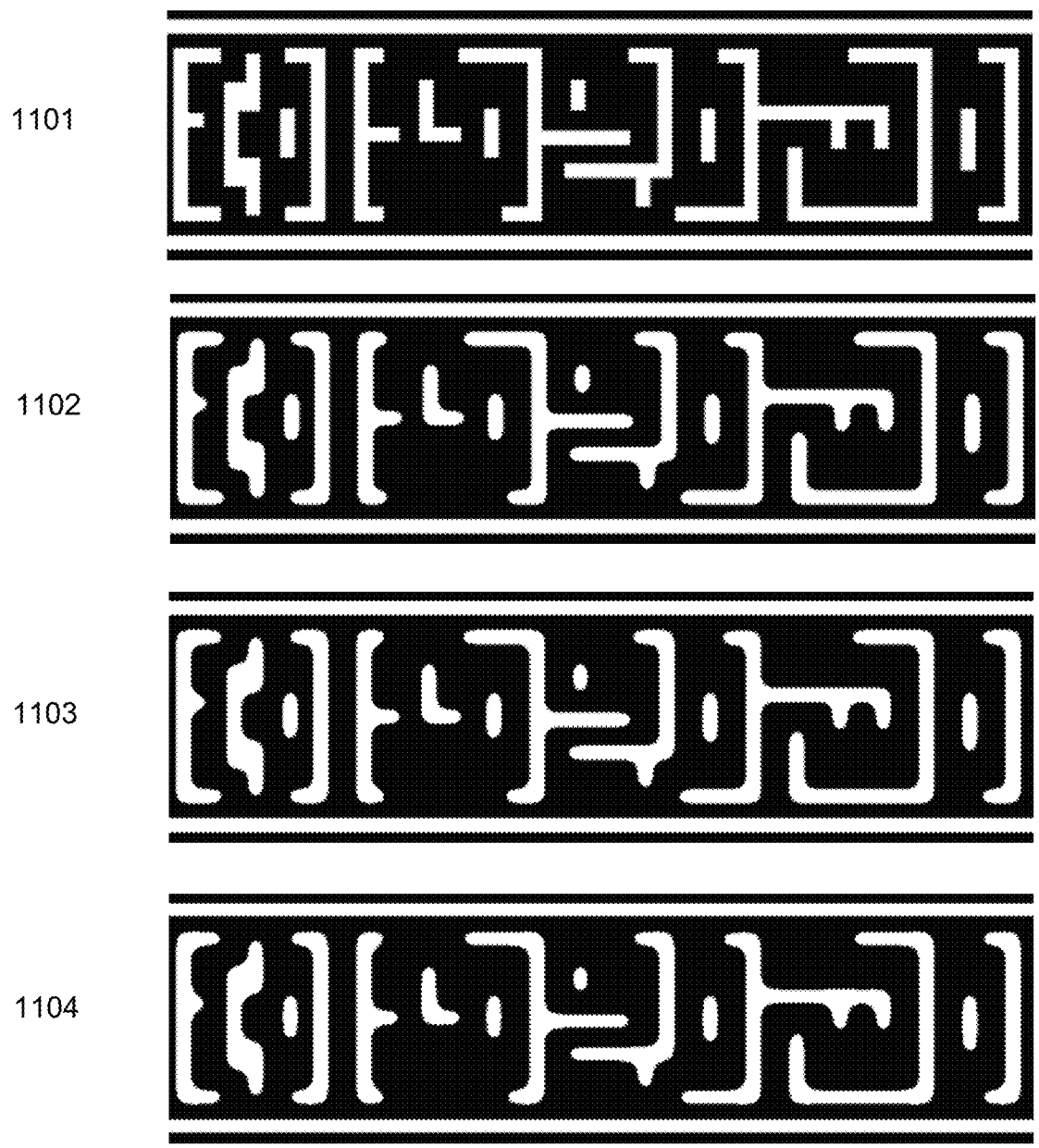
FIG. 11 illustrates examples of input physical designs, calculated mask images and generated deep learned images, in accordance with some embodiments.

An example inferred output is shown in FIG. 11, in which the reassembled tiles representing the images representative of the manufactured shapes of a D-type Flip Flop (DFF) design image 1101 under three different unique process conditions are shown. Though similar at first glance, it is apparent upon closer inspection that the three images are different, for example a different amount of corner rounding is apparent in each. The shapes of image 1102 are closest to the drawn rectilinear CAD shapes from the image 1101. The shapes of the image 1104 are perhaps the furthest away with a more significant degree of corner rounding and shape narrowing. Image 1103 lies somewhere between these two extremes. While this example shows just three examples as representative of semiconductor manufacturing process conditions for brevity, a more comprehensive set may include dozens, representing the different extremes of dose variation in mask manufacturing, and the different extremes of both dose variation and depth-of-focus variation in semiconductor manufacturing.

Figure 12:
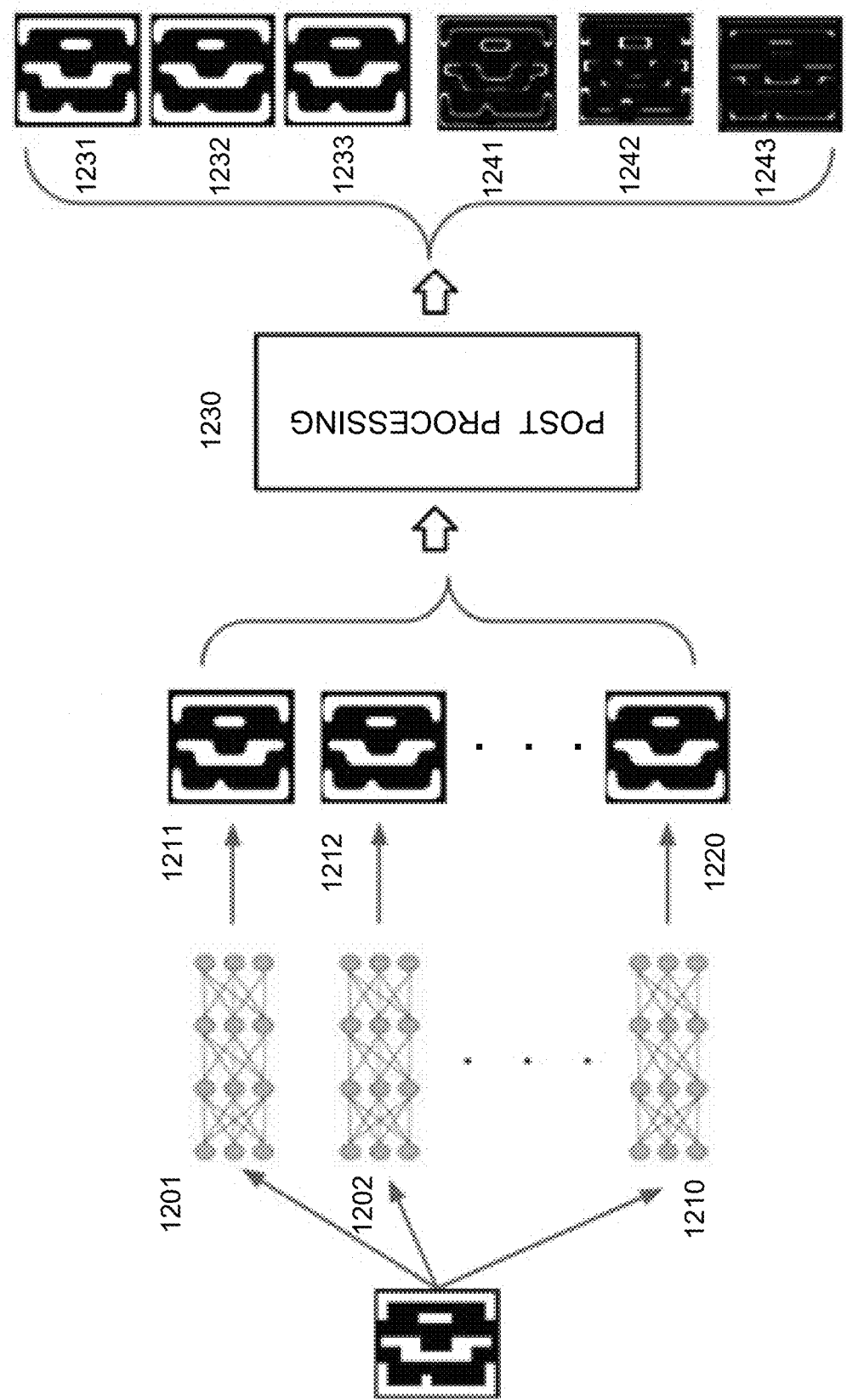
FIG. 12 illustrates an example neural network with post-processing, in accordance with some embodiments.

In another embodiment, FIG. 12 illustrates a process where after the single-output networks 1201, 1202 through 1210 are used to infer the output manufacturing images for each process corner 1211, 1212 through 1220, post processing 1230 may be used to combine and aggregate these per-corner images to produce a mean image 1233 representative of the typical set of manufacturing conditions, a maximum image 1231 representing of the most extreme result in which the most material may be deposited on the silicon, and a minimum image 1232 representing the most extreme results in which the least material may be deposited on the silicon.

Figure 13:
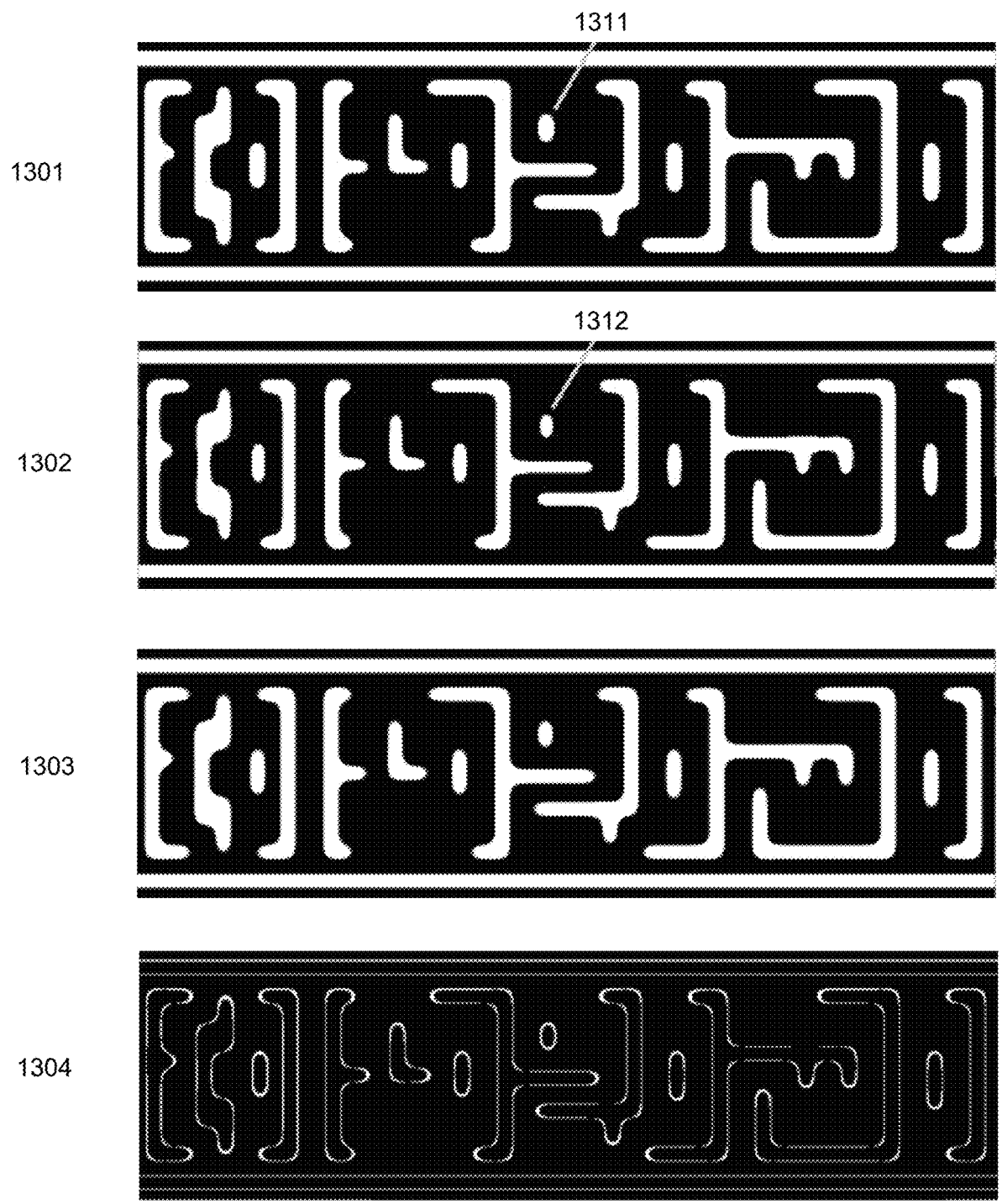
FIG. 13 illustrates examples of calculated mask images and generated deep learned images, in accordance with some embodiments.

Output images in detail shown in FIG. 13 produced by combining the per-corner image tiles. The maximum image 1301 may be computed by taking the pixel-wise maximum across all per-corner output images. The minimum image 1302 may be computed by taking the pixel-wise minimum across all per corner output images. Comparing the smallest oval shapes 1311 and 1312 near the center of both images clearly shows the difference, with the oval 1312 being much smaller in the case of the minimum image 1302 than the oval 1311 in the case of the maximum image 1301.

The mean image 1303 may be computed by taking the per-pixel sum divided by number of process corners, or pixel-wise mean across all per-corner output images. The process variation band or PV band image 1241 shown in FIG. 12 may be computed by a post processing step, by subtracting the minimum image from the maximum image. Illustrated in detail PV band image 1304 of FIG. 13, the white pixels show where metal may, or may not, be deposited on the silicon during manufacturing; i.e., each white pixel represents a region of uncertainty due to process variation. The more white pixels are present, the more susceptible is the design to manufacturing process variation.

Image thresholding compares each pixel value to a predetermined threshold value (e.g., 0.5), such that pixel values above the threshold value are converted to white (1.0), while those below the threshold value are converted to black (0.0). In another embodiment, image thresholding may be performed prior to computing the maximum, minimum or mean values. This refers to determining a single binary value per pixel (1 or 0 corresponding to white or black, respectively), e.g., for a metal manufacturing step, whether or not metal is present at each pixel location. In a further embodiment, the maximum, minimum and mean per-pixel values may be computed first, and then image thresholding performed afterwards.

Returning to FIG. 12, in order to compute metrics that represent a design/process combination's susceptibility or immunity to process variations, it may also be desirable to produce two additional images. These are false positives 1242, i.e., the manufactured image pixel locations in which material is deposited on silicon, but which were not set in the original CAD data (i.e. unintended material), and false negatives 1243, i.e., those output image pixel locations in which the original CAD data images were set as intended material, but which failed to be deposited during manufacturing.

Examples of false negatives occur at the 90 degree corners of drawn CAD polygons, in which sharp corners are drawn by the circuit designer, but a form of corner rounding and/or line pullback happens during manufacturing and the corners of the deposited material are effectively shaved or foreshortened. Examples of false positives are extra material produced in 270 degree corners for example, or extra material produced via pinching. In one embodiment, these false positive and false negative images, illustrated in FIG. 14, may be produced as a post processing step. The false positive image 1401 may be computed by subtracting the original CAD data image from the maximum image. The false negative image 1402 may be computed by taking the product (logical AND) of the minimum image, with the original CAD data image, thresholding the result, and then subtracting the thresholded result from the thresholded original CAD data image.

Figure 15:
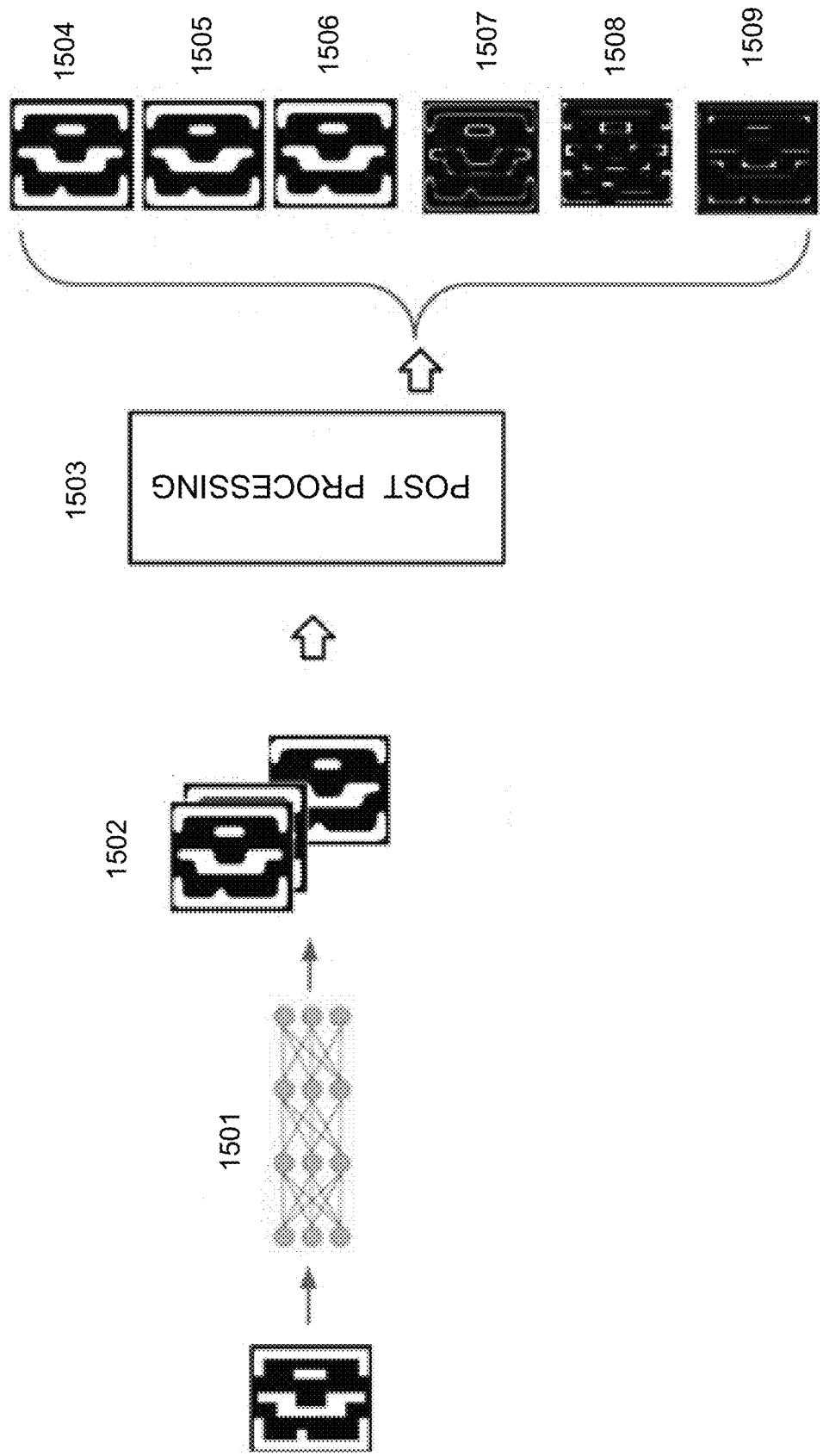
FIG. 15 illustrates a single, multi-corner neural network and a post processing step, in accordance with some embodiments.

To reduce the post-processing burden, in an embodiment, a CNN architecture with an output that consists of multiple channels is illustrated in FIG. 15. In one embodiment, the first N channels may be reserved for each of the N process corner conditions 1502. This is achieved by creating an output layer that consists of a 1×1 convolution operation with a filter depth of N, where N is the number of process corners. The intent is for a single, trained multiple-output network 1501 to produce an image corresponding to the manufactured output for each of the individual process corners 1502.

FIG. 15 also shows that the computation of the maximum 1504, minimum 1505, mean 1506, PV band 1507, false positive 1508 and false negative 1509 images may then be achieved as a post processing step 1503 as described in relation to FIG. 12, after the single, trained CNN 1501 is used to generate the multiple per-process-condition outputs 1502. It will be appreciated that any of the aggregate output images or any combination of these images may be obtained via post processing rather than directly being inferred by the network.

Figure 16:
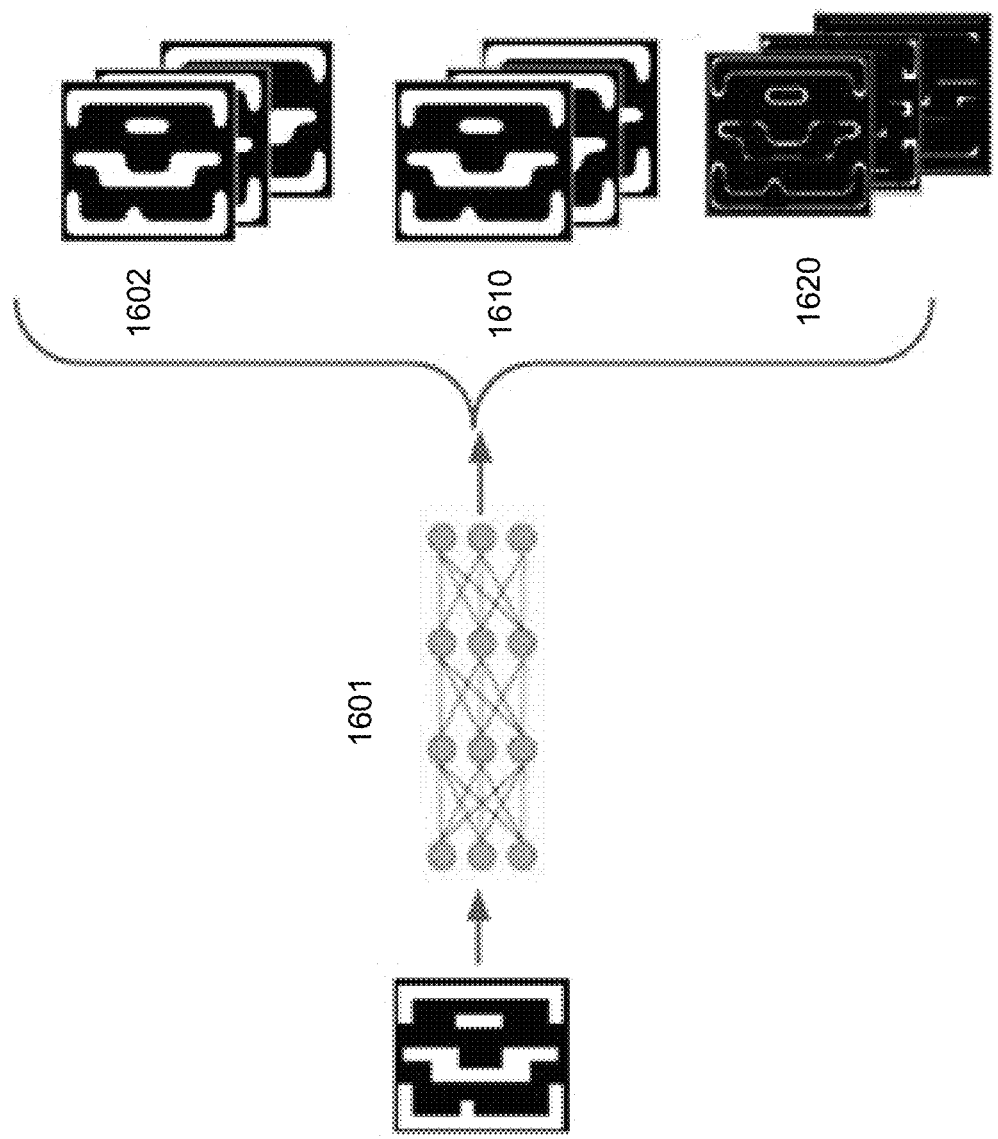
FIG. 16 illustrates an example neural network with multiple output channels, in accordance with some embodiments.

As noted previously, these images may be calculated via post processing of the minimum and maximum images and the input CAD data image. In an embodiment shown in FIG. 16, these images may also be directly produced by the deep neural network 1601, via the introduction of additional output image channels like process corners 1602, and minimum, maximum and mean 1610. PV band, false negatives and false positives 1620 may also be directly produced.

When the maximum, minimum and mean images, etc. are produced directly by the trained network, the individual per-process corner images 1602 may not need to be learned by/inferred by the network. In this case, the network is trained to directly output the aggregate images 1610 (maximum, minimum, mean) and 1620 (PV band, false positives, false negatives) without outputting the per-process corner images 1602. When the number of process corners to consider is large, it may be preferential (to reduce compute and/or GPU resources such as memory) to not output the per-process corner images 1602, and instead to only output the remaining aggregated images. In this case, the per-corner filters are removed from the CNN output layer, and their corresponding images removed during training. In an embodiment, the user may choose to have the network output all, some, or none of the per-corner images prior to training, and the network architecture and parameters for the neural network are adjusted accordingly.

While manufactured shapes on silicon are largely dependent on the immediate locality, or neighborhood, of the input shapes, there also exist long range effects such as local pattern density. Simply put, the manufactured shapes for the CAD data image tile of the image will contain some differences if that tile comes from a densely populated portion of a bigger design, compared to if it comes from a relatively isolated portion of the design. In order to allow the CNN model to learn these density effects, embodiments extend the input to contain multiple channels. In one such embodiment, the local pattern density can be encoded into a single number from 0.0 (total isolation) to 1.0 (completely surrounded by metal), and a grayscale image produced where all pixels are set to that same number. The grayscale image dimensions are set to be the same as the CAD data tile dimensions, and can be represented as an additional channel in the input image, much as color images are often represented as R,G,B channels for regular image processing. The CNN architecture is then extended to deal with a two-channel input instead of a single-channel input. During the training process, the network parameters will learn the relationship between the grayscale color level and the corresponding effects on the output manufactured image.

In an embodiment, the input image may consist of two channels, with each channel itself being representable as a grayscale image—one for the CAD data, and one for a lower resolution image of the larger area from which patch/tile was obtained, representative of local density information. In some embodiments, the output image may contain multiple channels with a different grayscale image per channel (e.g., channels representing the maximum image, the minimum image, the mean image, the PV band image, the false positive image, or the false negative image). In an additional embodiment, the output image may also contain additional channels, for example one per process corner where each per-corner image represents the expected manufactured shapes for that particular process corner unique combination of process variables.

In embodiments, methods for calculating a pattern to be manufactured on a substrate include inputting a physical design 900, inputting a set of parameters for a neural network to calculate a pattern to be manufactured on a substrate, generating a plurality of possible neighborhoods for the physical design (step 704 of FIG. 7), and calculating a plurality of patterns to be manufactured on the substrate (step 722) for the physical design in each possible neighborhood of the plurality of possible neighborhoods. Methods also include training (e.g., in the loop from step 725 to physical design 702) the neural network with the calculated plurality of patterns, where the training is performed using a computing hardware processor; and adjusting the set of parameters (e.g., in step 725) to reduce manufacturing variation for the calculated plurality of patterns to be manufactured on the substrate.

In some embodiments, the neural network may include using post-processing to aggregate variation in the variation band. The neural network may include multiple output channels to aggregate variation in the variation band. In some embodiments, methods include calculating a false negative and a false positive for the pattern on the substrate.

In some embodiments, the neural network comprises a single Fully Convolutional Network (FCN) architecture (e.g., FIG. 9). The FCN may include a first encoding layer, a second encoding layer, a last encoding layer and a bottleneck layer, wherein the last encoding layer and the bottleneck layer each employ dropout regularization. In some embodiments, the FCN includes a first decoding layer, a second decoding layer, a third decoding layer and a fourth decoding layer, where each of the decoding layers employ a concatenation with additional information from a fourth encoding layer, a third encoding layer, a second encoding layer and a first encoder layer, respectively.

In some embodiments, the physical design and the calculated plurality of patterns are each divided into tiles. For example, each of the tiles may comprise a 256×256 pixel tile with an inner core of 128×128 pixels and a halo 64 pixels wide. In some embodiments, calculating the pattern to be manufactured on the substrate comprises charged particle beam simulation. In some embodiments, calculating the pattern to be manufactured on the substrate comprises lithography simulation 720. In some embodiments, methods include inputting a local pattern density for the physical design 702.

Design Variability Metrics

The various aggregate images over variation can be used to produce scalar design variability metrics.

Let TP (True Positives) be the number of white pixels in the CAD design, representing where metal is ideally intended to be deposited in silicon manufacturing, and let TN (True Negatives) be the number of black pixels in the same image. Let VB (Variation Band) be the number of white pixels in the variation band plot which can serve as an upper bound on the uncertainty associated with metal deposits due to process variations.

Let FN (False Negatives) be the number of white pixels in the false negatives design image, representing how much of the metal that was ideally intended to be deposited in silicon manufacturing, but which in practice turns out not to be deposited due to corner rounding, line end pullback, etc. FN can be a metric serving as an upper bound on the measure of missing metal found after manufacturing.

Let FP (False Positives) be the number of white pixels in the false positives design image, representing how much metal was inadvertently deposited during silicon manufacturing in locations in which it ideally was not intended to be deposited. FP can be a metric serving as an upper bound on the measure of the undesired material that was deposited during manufacturing.

The Matthews Correlation Coefficient (MCC) is defined as follows and is often used as a single metric by which classification algorithms are measured when using the TP, FP, TN, FN measurements from a confusion matrix.

$$MCC = \frac{TP \times TN - FP \times FN}{\sqrt{(TP+FP)(TP+FN)(TN+FP)(TN+FN)}}$$

In this semiconductor manufacturing scenario, the MCC formula has a different meaning from conventional uses since the 4 variables TP, TN, FP and FN for semiconductor manufacturing applications of the present disclosure have different meanings. Since in this case the MCC is a function of the amount of intended metal (TP), unintended metal (TN), an upper bound on inadvertently removed metal where it was original intended (FN) and an upper bound on inadvertently deposited metal where it was original unintended (FP), an MCC score computed via this formula can serve as single scalar value measure of how the process variability will tend to produce on-silicon images which are different from intended images (per the originally drawn CAD data). A large value of MCC (close to 1.0) indicates a good correlation between the CAD data image and the manufactured silicon image; that is, high immunity to process variations. A very small value of MCC (closer to 0) indicates very little correlation between the intended image and the manufactured image. MCC values can be improved by modifying the manufacturing process, so that it has less variation, which may be difficult and expensive, or by modifying the design, or a combination of both approaches. Integrated Device Manufacturers (IDM)s may be in a position to modify the process for key designs for which a high level of reproducibility (yield) is required.

Precision may be defined as TP divided by the sum of TP and FP, and recall may be defined as TP divided by the sum of TP and FN. Precision and recall may be used to compute another metric, F1.

$$Precision = \frac{True\ Positive}{True\ Positive + False\ Positive}$$

$$Recall = \frac{True\ Positive}{True\ Positive + False\ Negative}$$

The formula for computing an F1 score from these images is shown below:

$$F_1 = \left(\frac{2}{recall^{-1} + precision^{-1}}\right) = 2 \cdot \frac{precision \cdot recall}{precision + recall}.$$

Note that the MCC value takes all 4 quantities (TP, TN, FP, FN) into account, and thus may be considered to be a more useful metric than the F1 formula which does not include the TN quantity, and so can become skewed for imbalanced class problems (where TP is significantly different from TN). This is one of the reasons why MCC is conventionally a preferred quantity to use for classification algorithms.

Let TP2 be the number of white pixels in the mean image, after the grayscale mean image has been thresholded. This represents the number of pixels in which a designer may realistically expect metal to be deposited by a realistic process. Designers are aware that processes are non-ideal, and that effects such as corner rounding will occur during manufacturing. Designers will however continue to draw rectilinear images with square corners during the circuit design processes, simply due to drawing convenience. With TP as the number of (ideal) white pixels originally drawn, and TP2 as the number of white pixels that can more realistically be expected by a designer, two more quantities can be defined.

Let VBI=VB/TP2, which is the ratio of the number of variation-band white pixels to the mean (realistically expected) image white pixels. This is now a more realistic measure of how susceptible the design is to variation for a given process, as the numerator VB still contains an uncertainty term, the amount of pixels for which the manufacturing output is uncertain. VB is then normalized by the denominator TP2, the amount of pixels for which metal can be realistically expected, on average, across the process variations.

A second measure VBI'=VB/TP serves as the ratio of the manufacturing uncertainty to the originally drawn number of white pixels (expected result in an unrealistic, but ideal manufacturing scenario).

With these definitions in place, different designs/cells or design candidates produced by a designer can be, in accordance with embodiments, processed by a trained neural network, their various aggregate manufactured-output images produced, those images' respective white pixels counted as outlined above, and then the designs can be subsequently scored with metrics in terms of their immunity to process variation (MCC), or their susceptibility to process variation (VBI).

Deep Learning Challenges

In a deep-convolutional neutral network or, deep learning, a computer model learns to perform classification or regression tasks directly from images, text, or sound. Deep learning models can achieve state-of-the-art accuracy, in some perception applications sometimes exceeding human-level performance. Models are trained by using a large set of labeled data and neural network architectures that contain many layers. Most deep learning methods useneural network architectures, which is why deep learning models are often referred to as deep neural networks. The term "deep" usually refers to the number of hidden layers in the neural network. Traditional neural networks only contain 2-3 hidden layers, while deep networks can have as many as 150.

Deep learning models are trained by using large sets of labeled data and neural network architectures. One of the most popular types of deep neural networks is the CNN architecture. The CNN architecture convolves learned features with input data, and typically uses 2D convolutional layers, making this architecture well suited to processing 2D data, such as images.

CNNs eliminate the need for manual feature extraction, i.e. remove the need to pre-identify features used to classify or predict images. The CNN works by extracting features directly from images. The relevant features are not pre-trained; they are learned while the network trains on a sufficiently large collection of images. This automated feature extraction makes deep learning models highly accurate for general computer vision tasks such as object classification, and for semiconductor manufacturing image-to-image transformation tasks such as in the present invention.

There are several main reasons why deep learning has only recently become useful:

Deep learning requires large amounts of labeled data
Deep learning requires substantial computing power
Deep learning is an iterative process Deep learning requires large amounts of labeled data. For example, driverless car development requires millions of images and thousands of hours of video. In the case of the present disclosure, obtaining the labeled data refers to the gathering a large collection of many thousands to millions of images representative of the physical design to be manufactured, and the image-based outputs of the various computational steps of FIG. 7 such as OPC/ILT, Mask Process Simulation, Substrate Simulation, etc.

Some of the data could be gathered by the actual manufacturing of dedicated test chips but given the costs of mask set production and manufacturing for today's dense processes, this manufacturing-based data gathering approach is prohibitively expensive. An alternative would be to substitute computational simulation for manufacturing, but given the immense computational costs associated with any of the steps of FIG. 7, this choice has also been prohibitively expensive in terms of required compute power until very recently. In particular, the OPC/ILT computations required to compute the mask shapes that lead to manufacturable designs have required enormous compute power. ILT/OPC calculation tools, coupled with highly parallel and GPU accelerated computational design platforms have now finally made it possible to use computational software to determine mask shapes for full-reticle-sized IC designs within a timeframe that makes production of sufficient quantities of the required labeled data for deep learning to be no longer prohibitive.

Deep learning requires substantial computing power. High-performance GPUs have a parallel architecture that is efficient for deep learning. When combined with clusters or cloud computing, this may enable development teams to reduce training time for a deep learning network from weeks to hours or less, depending on the problem and the complexity of the deep learning neural network architecture. Dedicated architectures for highly computational computing such as one described in FIGS. 17 and 18 can accelerate the application of deep learning to problems that would have been previously intractable.

A sequential process for deep learning comprises: loading/preprocessing data, and fitting a model to make predictions. This sequential approach is certainly reasonable and helpful to see, but in reality, deep learning is rarely so linear. Instead, practical deep learning to produce learned images such as in FIG. 9, has a distinct cyclical nature that demands constant iteration, tuning, and improvement. The cycle begins iterating from an input physical design 900, calculating mask images and then comparing the images with output images 920 generated through deep learning. As each process concludes, its effects on how the model performs is measured and adjustments are made to improve performance in the next cycle.

The deep learning practitioner has to deal with the following iterative processes:

The Model Level: Fitting Model Parameters
The Micro Level: Tuning Hyperparameters
The Macro Level: Solving the Problem
The Meta Level: Improving the Training/Test Data
The Model Level: Fitting Parameters The first level where iteration plays a big role is at the model level. Any model, whether it be a regression model, a decision tree, or a neural network, is defined by many (sometimes even millions) of model parameters. For example, a regression model is defined by its feature coefficients, a decision tree is defined by its branch locations, and a neural network is defined by the weights connecting its layers. In deep learning, the model parameters are learned via iterative approaches such as gradient descent, an iterative method for finding the minimum of a function. In deep learning, that function is typically the loss (or cost) function. "Loss" may be a metric that quantifies the cost of wrong prediction, such as mean squared error, mean absolute error, cross entropy, etc. Gradient descent calculates the loss achieved by a model with a given set of parameters, and then adjusts those parameters to reduce the loss. This process is repeated until that loss cannot substantially be reduced further.

The Micro Level: Tuning Hyperparameters

Hyperparameters are "higher-level" parameters that cannot be learned directly from the data using gradient descent or other optimization algorithms. For example, dropout is a regularization method that approximates training a large number of neural networks with different architectures in parallel. During training, some number of layer outputs are randomly ignored or "dropped out." This has the effect of making the layer look-like and be treated-like a layer with a different number of nodes and connectivity to the prior layer. In effect, each update to a layer during training is performed with a different "view" of the configured layer. Conceptually, dropout breaks-up situations where network layers co-adapt to correct mistakes from prior layers, in turn making the model more robust. Hyperparameters describe structural information about a model that must be decided before fitting model parameters, such as whether dropout or other forms of regularization should be included in the model, whether batch normalization should be performed before computing the output of layers, deciding the number of epochs (external iterations to use in the model parameter fitting process) and specific optimizer algorithms to use during model parameter fitting and whether to use cross-validation to validate the model during fitting. Determining an appropriate value for each of these various parameters/decisions is an iterative process, requiring many iterations of the model parameter fitting process described above.

The Macro Level: Solving the Problem

There is no one model architecture/family that works best for every problem. Depending on a variety of factors such as the type of data, problem domain, sparsity of data, and even the amount of data that has been collected, different model families will perform better than others.

Therefore, one way to improve a candidate solution for a given problem is to try several different model families or model architectures, for example the shape of the network itself, the number of filter layers and the size of the convolutional kernel to use in the convolutional layers, and whether or not to use skip layer techniques. Determining an appropriate value for each of these various parameters/decisions is an iterative process, requiring many iterations of the model parameter fitting and hyperparameter tuning process described above.

Another way to improve the deep learned solution is by combining multiple deep learned models into an ensemble. This is a direct extension from the iterative process needed to fit those models. A common form of creating an ensemble is averaging the predictions from multiple trained models. There are more advanced ways to combine multiple models, but the iteration needed to fit multiple models is the same. Determining an appropriate combination/ensemble for each of the various deep learned models is an iterative process.

The Meta Level: Improving the Training/Test Data

When it comes to machine learning, better data generally adds more value than better algorithms. However, better data is not the same as more data. Better data means having fewer missing data and having lower measurement error (e.g., more accurate data). The data also needs to be representative, avoiding problems known to those familiar with the art such as data imbalance. The overall process of obtaining such a sufficient set of clean, accurately labeled data is itself often an iterative process. In the case of the present disclosure the iterative process involves running of more simulations of the various steps of FIG. 7 under different conditions, ensuring sufficiently wide sampling of possible neighborhoods is performed, etc. The learning process involves determining the various types of shape combinations that will be present in a cell design such as the physical design input to FIG. 7, in order to allow a deep learned model to perform well on shape combinations it has not been exposed to before.

The various iterations of the above process to train a deep learned model to a sufficient level of accuracy in practice require an immense amount of computing power, and an immense amount of data relevant to the semiconductor manufacturing process. Prior to recent developments in the semiconductor manufacturing computation industry, and to the recent ability to run the computational software simulators on dedicated GPU-accelerated hardware, such a deeply nested iterative process to deep learn the patterns to be manufactured on a substrate such as a silicon wafer would not have been tractable, and one would not have been motivated to even attempt such an approach.

Neural networks, such as CNNs, need to be trained with training data. Typically, the higher the capacity of the network (a measure of its ability to generalize to unseen data), plus the more parameters it has, the larger the number of data samples required to train it without overfitting. The networks considered here typically contain hundreds of thousands of learnable parameters, requiring an extremely large amount of training data samples.

A supervised training paradigm supplies the CNN with a large (hundreds of thousands to millions) number of input/output pairs. In the case of the present invention, the input item consists of a patch of CAD data—i.e. a set of CAD data that is representative of a physical design drawn by a circuit designer, where the set of CAD data has been rasterized and split up into patches or tiles. For each layer to be manufactured, the input image is a single channel-image with a specific width and height. The input image may be a binary image (each pixel is either black or white), or a grayscale image, where each pixel takes on a continuous value from 0.0 (black) to 1.0 (white). The output item in each pair consists of the corresponding expected image after manufacturing at some specific process corner. In one embodiment, the output item is a single-channel output image, again containing either binary valued pixels, or grayscale (continuously valued) pixels. The intent is to train the network to be able to infer or predict the output images given only the input images. The intent is also to train the network to be able to infer/predict output images for design input images it has never seen before.

Note that while the creation of a sufficient volume of the input image data (CAD data) may be relatively quick, the creation of the corresponding expected output image data representative of manufacturing results is an extremely lengthy problem for real semiconductor manufacturing processes with leading-edge process nodes, involving a vast amount of computing hardware resources. The CAD data may need to be simulated using a variety of computationally-intensive algorithms, including but not limited to OPC and ILT and wafer manufacturing simulation using a calibrated mask model. Such simulation tools and models may be used along with dedicated GPU-based hardware in the form of a high-performance computing cluster (HPC) or Computational Data Platform (CDP) for accelerating the simulations. Only after a series of such tools have been run can the output images be obtained. Further, when process variations are to be considered, the creation of the corresponding per-process corner images adds significant additional cost. Only very recently have semiconductor process manufacturing simulation tools, particularly ILT, become fast enough to enable the generation of the necessary high volumes of data in a realistic timeframe.

Figure 17:
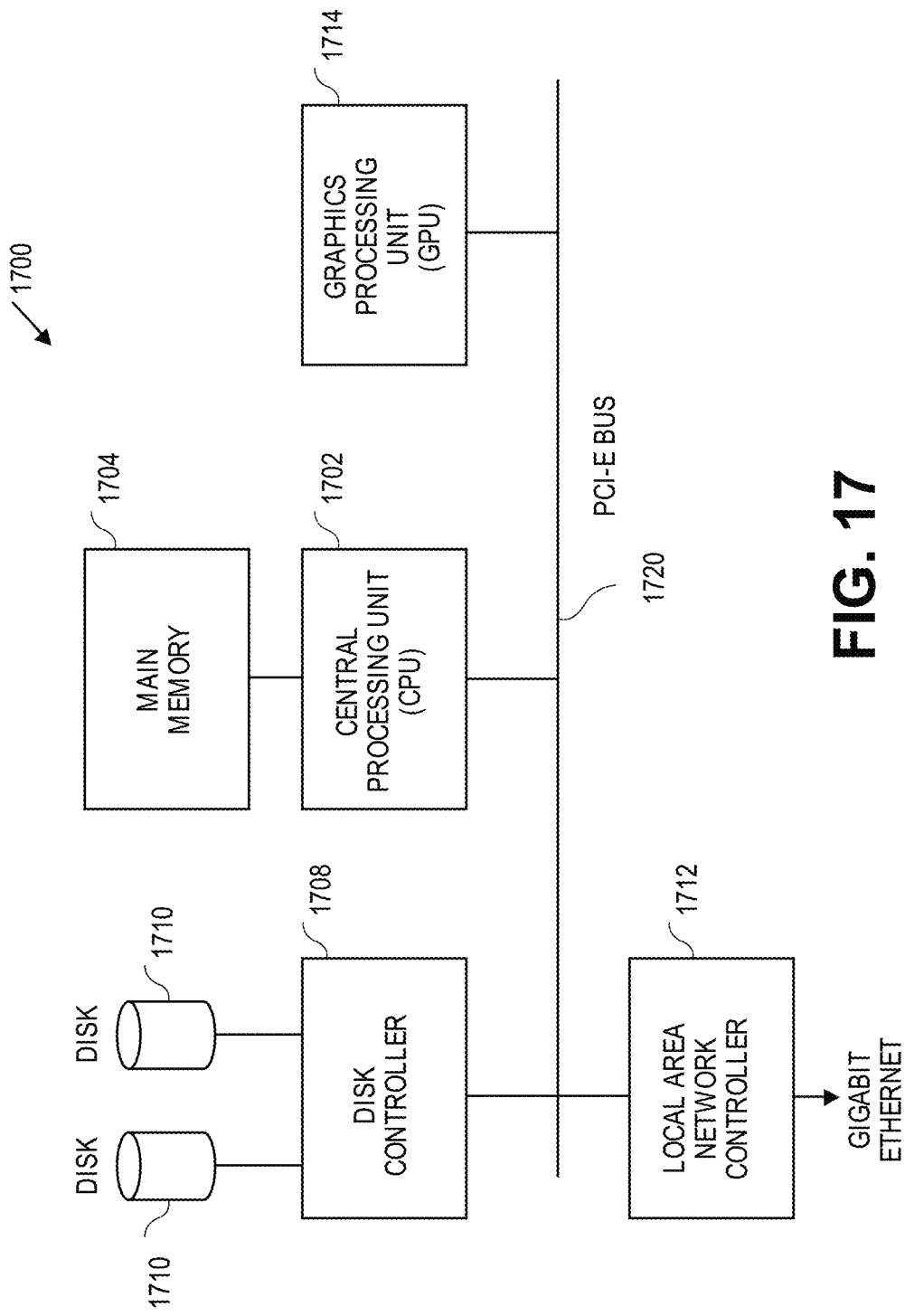
FIGS. 17 and 18 are schematics of GPU system diagrams, in accordance with some embodiments.

FIG. 17 illustrates an example of a computing hardware device 1700 that may be used to perform the calculations described in this disclosure. Computing hardware device 1700 comprises a central processing unit (CPU) 1702, with attached main memory 1704. The CPU may comprise, for example, eight processing cores, thereby enhancing performance of any parts of the computer software that are multi-threaded. The size of main memory 1704 may be, for example, 64 G-bytes. The CPU 1702 is connected to a Peripheral Component Interconnect Express (PCIe) bus 1720. A graphics processing unit (GPU) 1714 is also connected to the PCIe bus. In computing hardware device 1700 the GPU 1714 may or may not be connected to a graphics output device such as a video monitor. If not connected to a graphics output device, GPU 1714 may be used purely as a high-speed parallel computation engine. The computing software may obtain significantly higher performance by using the GPU for a portion of the calculations, compared to using CPU 1702 for all the calculations. The CPU 1702 communicates with the GPU 1714 via PCIe bus 1720. In other embodiments (not illustrated) GPU 1714 may be integrated with CPU 1702, rather than being connected to PCIe bus 1720. Disk controller 1708 may also be attached to the PCIe bus, with, for example, two disks 1710 connected to disk controller 1708. Finally, a local area network (LAN) controller 1712 may also be attached to the PCIe bus, and provides Gigabit Ethernet (GbE) connectivity to other computers. In some embodiments, the computer software and/or the design data are stored on disks 1710. In other embodiments, either the computer programs or the design data or both the computer programs and the design data may be accessed from other computers or file serving hardware via the GbE Ethernet.

Figure 18:
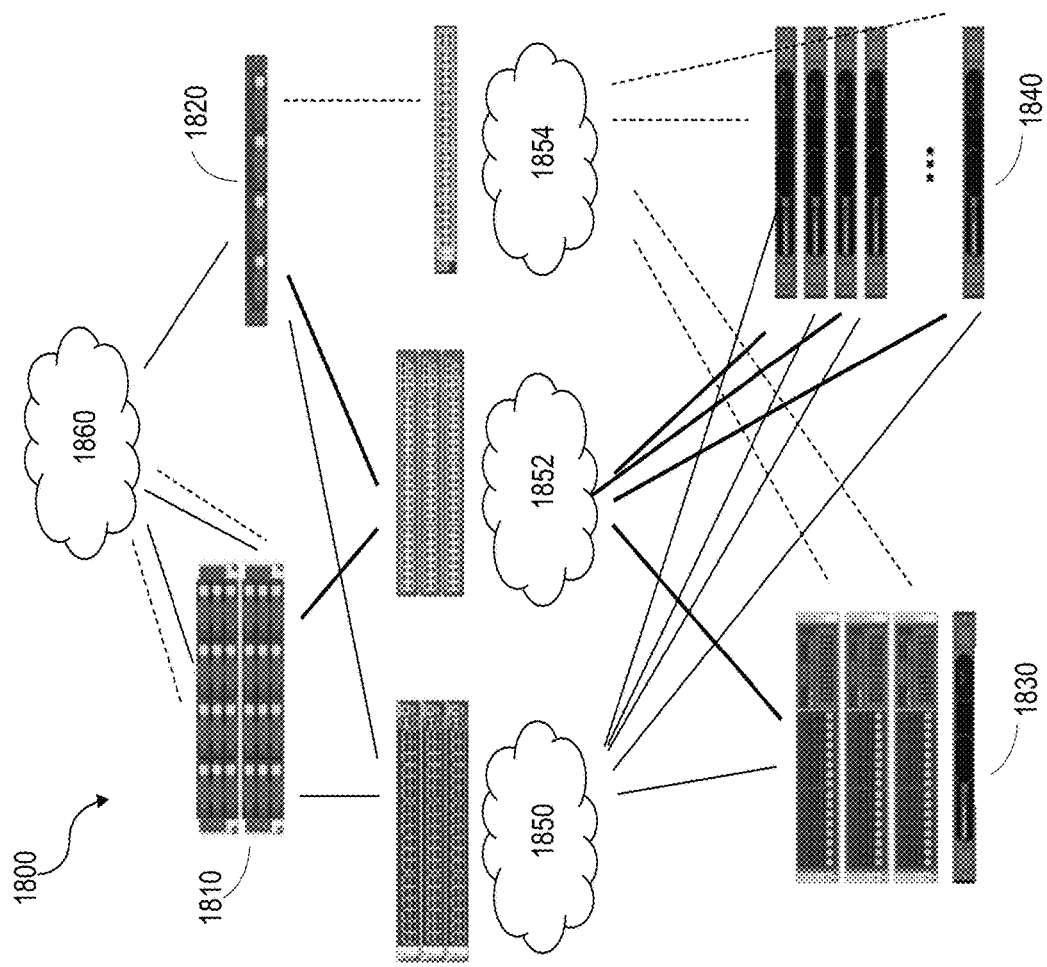

FIG. 18 is another embodiment of a system for performing the computations of the present embodiments. The system 1800 may also be referred to as a CDP, and includes a master node 1810, an optional viewing node 1820, an optional network file system 1830, and a GPU-enabled computing node 1840. Viewing node 1820 may not exist or instead have only one node, or may have other numbers of nodes. GPU-enabled computing node 1840 can include one or more GPU-enabled nodes forming a cluster. Each GPU-enabled computing node 1840 may comprise, for example, a GPU, a CPU, a paired GPU and CPU, multiple GPUs for a CPU, or other combinations of GPUs and CPUs. The GPU and/or CPU may be on a single chip, such as a GPU chip having a CPU that is accelerated by the GPU on that chip, or a CPU chip having a GPU that accelerates the CPU. A GPU may be substituted by another co-processor.

The master node 1810 and viewing node 1820 may be connected to network file system 1830 and GPU-enabled computing nodes 1840 via switches and high-speed networks such as networks 1850, 1852 and 1854. In an example embodiment, networks 1850 can be a 56 Gbps network, 1852 can be a 1 Gbps network and 1854 can be a management network. In various embodiments, fewer or greater numbers of these networks may be present, and there may be various combinations of types of networks such as high and low speeds. The master node 1810 controls the CDP 1800. Outside systems can connect to the master node 1810 from an external network 1860. In some embodiments, a job may be launched from an outside system. The data for the job is loaded onto the network file system 1830 prior to launching the job, and a program is used to dispatch and monitor tasks on the GPU-enabled computing nodes 1840. The progress of the job may be seen via a graphical interface, such as the viewing node 1820, or by a user on the master node 1810. The task is executed on the CPU using a script which runs the appropriate executables on the CPU. The executables connect to the GPUs, run various compute tasks, and then disconnect from the GPU. The master node 1810 may also be used to disable any failing GPU-enabled computing nodes 1840 and then operate as though that node did not exist.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods may be practiced by those of ordinary skill in the art, without departing from the scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for calculating a pattern to be manufactured on a substrate used to create an integrated circuit (IC), the method comprising:
   receiving a physical design pattern produced by a computer aided design application to represent a portion of a circuit design of the IC;
   determining a plurality of possible neighborhoods for the physical design pattern;
   generating a plurality of possible mask designs for the physical design pattern, wherein the plurality of possible mask designs corresponds to the plurality of possible neighborhoods;
   calculating a plurality of possible patterns on the substrate, wherein the plurality of possible patterns on the substrate correspond to the plurality of possible mask designs;
   calculating a variation band from the plurality of possible patterns on the substrate; and
   modifying the physical design pattern to reduce the variation band.

2. The method of claim 1 further comprising calculating a plurality of mask images from the plurality of possible mask designs.

3. The method of claim 2, wherein calculating the plurality of possible mask images comprises performing charged particle beam simulation.

4. The method of claim 1, wherein modifying the physical design pattern comprises modifying the plurality of possible neighborhoods of the physical design pattern.

5. The method of claim 1, wherein the variation band corresponds to a set of manufacturing variation parameters.

6. The method of claim 1, wherein the variation band comprises a process variation with a lower bound and an upper bound surrounding a nominal substrate pattern.

7. The method of claim 1 further comprising performing a coloring step separating shapes of the physical design pattern into layers.

8. The method of claim 7, wherein modifying the physical design pattern includes modifying the coloring step.

9. The method of claim 1, wherein generating the plurality of possible mask designs comprises performing optical proximity correction (OPC) of the physical design pattern.

10. The method of claim 1, wherein determining the plurality of possible neighborhoods, generating the plurality of possible mask designs, or calculating the plurality of possible patterns on the substrate comprises using a neural network.

11. The method of claim 10 further comprising using post-processing to aggregate variation in the variation band.

12. The method of claim 10, wherein the neural network further comprises multiple output channels to aggregate variation in the variation band.

13. The method of claim 1 further comprising calculating false negatives and false positives for the plurality of possible patterns on the substrate.

14. The method of claim 1, wherein calculating the plurality of possible patterns on the substrate comprises performing lithography simulation.

15. The method of claim 1, wherein the physical design pattern comprises a portion of an entire design, wherein the method further comprises determining a set of actual neighborhoods in which the physical design pattern is used in the entire design.

16. The method of claim 15, wherein the portion of the entire design is an instance of the physical design pattern and the plurality of possible neighborhoods includes all neighborhoods of each instance.

17. The method of claim 1, wherein each possible neighborhood in the plurality of possible neighborhoods is one possible neighborhood that surrounds the physical design pattern, wherein the plurality of possible neighborhoods comprise different shapes or different orientations of shapes.

18. A non-transitory machine readable medium storing a program for calculating a pattern to be manufactured on a substrate used to create an integrated circuit (IC), the program for execution by at least one processing unit, the program comprising sets of instructions for:
receiving a physical design pattern produced by a computer aided design application to represent a portion of a circuit design of the IC;
determining a plurality of possible neighborhoods for the physical design pattern;
generating, for the received physical design pattern, a plurality of possible mask designs corresponding to the plurality of possible neighborhoods;
calculating a plurality of possible patterns that are expected to be produced on the substrate for the plurality of possible mask designs;
calculating a variation band that expresses a difference between the plurality of possible patterns that are expected to be produced on the substrate; and
directing a physical design tool to modify the physical design pattern in order to reduce the variation band.

19. The non-transitory machine readable medium of claim 18, wherein the program further comprises a set of instructions for calculating a plurality of mask images from the plurality of possible mask designs.

20. The non-transitory machine readable medium of claim 18, wherein the physical design tool modifies the physical design pattern by modifying the plurality of possible neighborhoods of the physical design pattern.

21. The non-transitory machine readable medium of claim 18, wherein the variation band comprises a process variation with a lower bound and an upper bound surrounding a nominal substrate pattern.

22. The non-transitory machine readable medium of claim 18, wherein the set of instructions for at least one of determining the plurality of possible neighborhoods, generating the plurality of possible mask designs, or calculating the plurality of possible patterns that are expected to be produced on the substrate comprises a set of instructions for using a neural network.

23. A method for modifying a physical design pattern to be manufactured on a substrate, the physical design pattern part of an integrated circuit (IC) design layout and produced by a computer design application to represent a portion of a circuit design of the IC, the method comprising:
calculating, for the physical design pattern produced by the computer design application to represent the portion of the circuit design of the IC, a plurality of possible patterns that are predicted to be manufactured on the substrate based on different possible neighborhoods for the physical design pattern in the IC design layout;
calculating a variation band from the plurality of possible patterns on the substrate; and
modifying the physical design pattern in order to reduce the variation band.

24. The method of claim 23, wherein the plurality of possible patterns is further based on variations in at least one manufacturing process parameter.

25. The method of claim 23 further comprising generating a plurality of possible mask designs for the physical design pattern, wherein the plurality of possible mask designs corresponds to the plurality of possible neighborhoods.

26. A method for calculating a pattern to be manufactured on a substrate, the method comprising:
receiving a physical design pattern;
determining a plurality of possible neighborhoods for the physical design pattern;
generating a plurality of possible mask designs for the physical design pattern, wherein the plurality of possible mask designs corresponds to the plurality of possible neighborhoods;
using a neural network to calculate a plurality of possible patterns on the substrate, wherein the plurality of possible patterns on the substrate correspond to the plurality of possible mask designs, and the neural network comprises a plurality of output channels each of which outputs a different calculated possible pattern;
calculating a variation band from the plurality of possible patterns on the substrate; and
modifying the physical design pattern to reduce the variation band.

* * * * *